US007205867B2

(12) United States Patent
Lutz et al.

(10) Patent No.: US 7,205,867 B2
(45) Date of Patent: Apr. 17, 2007

(54) MICROELECTROMECHANICAL RESONATOR STRUCTURE, AND METHOD OF DESIGNING, OPERATING AND USING SAME

(75) Inventors: Markus Lutz, Palo Alto, CA (US); Aaron Partridge, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 146 days.

(21) Appl. No.: 11/132,941

(22) Filed: May 19, 2005

(65) Prior Publication Data

US 2006/0261915 A1   Nov. 23, 2006

(51) Int. Cl.
*H03H 9/46* (2006.01)
(52) U.S. Cl. .................. 333/186; 310/309; 333/219
(58) Field of Classification Search ................ 333/186
See application file for complete search history.

(56) References Cited

U.S. PATENT DOCUMENTS

| 5,175,521 | A | * | 12/1992 | Larson ........................ 333/235 |
| 6,218,915 | B1 | * | 4/2001 | Schallner .................... 333/219 |
| 6,249,073 | B1 | | 6/2001 | Nguyen et al. |
| 6,452,465 | B1 | | 9/2002 | Brown et al. |
| 6,577,040 | B2 | | 6/2003 | Nguyen |
| 6,624,726 | B2 | | 9/2003 | Niu et al. |
| 6,628,177 | B2 | | 9/2003 | Clark et al. |
| 6,856,217 | B1 | | 2/2005 | Clark et al. |
| 6,894,586 | B2 | | 5/2005 | Bircumshaw et al. |
| 7,012,479 | B2 | * | 3/2006 | Akiba et al. ................. 333/110 |
| 2002/0041220 | A1 | | 4/2002 | Nguyen |

(Continued)

FOREIGN PATENT DOCUMENTS

| WO | WO 2004/083781 | 9/2004 |
| WO | WO 2005/015735 | 2/2005 |

OTHER PUBLICATIONS

"Mechanically Corner-Coupled Square Microresonator Array for Reduced Series Motional Resistance", Demirci et al., Dig. of Tech. Papers, the 12$^{th}$ Int. Conf. on Solid-State Sensors & Actuators (Transducers '03). Boston, Massachussets, Jun. 8-12, 2003, pp. 955-958.

(Continued)

*Primary Examiner*—Barbara Summons
(74) *Attorney, Agent, or Firm*—Neil A. Steinberg

(57) ABSTRACT

A micromechanical resonator structure including a plurality of straight or substantially straight beam sections that are connected by curved or rounded sections. Each elongated beam section is connected to another elongated beam section at a distal end via the curved or rounded sections thereby forming a geometric shape having at least two elongated beam sections that are interconnected via curved or rounded sections (for example, a rounded triangle shape, rounded square or rectangle shape). The structure includes one or more nodal points or areas (i.e., portions of the resonator structure that are stationary, experience little movement, and/or are substantially stationary during oscillation of the resonator structure) in one or more portions or areas of the curved sections of the structure. The nodal points are suitable and/or preferable locations to anchor the resonator structure to the substrate. In operation, the resonator structure oscillates in a combined elongating (or breathing) mode and bending mode; that is, the beam sections (which oscillate or vibrate at the same frequency) exhibit an elongating-like (or breathing-like) motion and a bending-like motion.

35 Claims, 45 Drawing Sheets

U.S. PATENT DOCUMENTS

| | | |
|---|---|---|
| 2002/0105393 A1 | 8/2002 | Clark et al. |
| 2004/0085159 A1 | 5/2004 | Kubena et al. |
| 2004/0095210 A1 | 5/2004 | Nguyen |
| 2004/0113722 A1 | 6/2004 | Bircumshaw et al. |
| 2004/0207492 A1 | 10/2004 | Nguyen et al. |
| 2005/0073078 A1 | 4/2005 | Lutz et al. |
| 2005/0174197 A1 | 8/2005 | Nguyen et al. |
| 2005/0206479 A1 | 9/2005 | Nguyen et al. |

OTHER PUBLICATIONS

"High-Q Single Crystal Silicon HARPSS Capacitive Beam Resonators with Self-Aligned Sub-100nm Transduction Gaps", Pourkamali et al., Journal of Microelectromechanical Systems, vol. 12, No. 4, Aug. 2003, pp. 487-496.

"A High Aspect-Ratio Polysilicon Vibrating Ring Gyroscope", Ayazi et al., Solid-State Sensor and Actuator Workshop, Hilton Head Island, South Carolina, Jun. 4-8, 2000, pp. 289-292.

"Shape Effect on Mechanical Quality Factor of Micro-Resonator", Kobayashi et al., Micro Electro Mechanical Systems, 1998, MEMS 98, Proceedings, The Eleventh Annual International Workshop on Heidelberg, Germany Jan. 25-29, 1998, New York, NY, USA, IEEE US, Jan. 25, 1998, pp. 195-200.

"Micromechanical Hollow-Disk Ring Resonators", Li et al., Micro Electro Mechanical Systems, 2004, 17th IEEE International Conference on MEMS, Maastricht, Netherlands Jan. 25-29, 2004, Piscataway, NJ, USA, IEEE, US, Jan. 25, 2004, pp. 821-824.

"UHF Micromechanical Extensional Wine-Glass Mode Ring Resonators", Xie et al., International Electron Devices Meeting 2003, IEDM, Technical Digest, Washington, DC, Dec. 8-10, 2003, New York, NY, IEEE US, Dec. 8, 2003, pp. 953-956.

"Low Motional Resistance Ring-Shaped Contour-Mode Aluminum Nitride Piezoelectric Micromechanical Resonators for UHF Applications", Piazza et al., Micro Electro Mechanical Systems, 2005, MEMS 2005, 18th IEEE International Conference on Miami Beach FL, USA, Jan. 30-Feb. 3, 2005, Piscataway, NJ, USA, IEEE Jan. 30, 2005, pp. 20-23.

"Integrated HF CMOS-MEMS Square-Frame Resonators with On-Chip Electronics and Electrothermal Narrow Gap Mechanism", Lo et al., Solid-State Sensors, Actuators and Microsystems, 2005, Digest of Technical Papers, Transducers '05, The 13th International Conference on Seoul, Korea, Jun. 5-9, 2005, Piscataway, NJ, USA, IEEE, Jun. 5, 2005, pp. 2074-2077.

"Vibrating RF MEMS for Next Generation Wireless Applications", Nguyen, Custom Integrated Circuits Conference, 2004, Proceedings of the IEEE 2004, Orlando, FL, USA, Oct. 3-6, 2004, Piscataway, NJ, USA, IEEE, Oct. 3, 2004, pp. 257-264.

"Fully-Differential Poly-SiC Lame-Mode Resonator and Checkerboard Filter", Bhave et al., Micro Electro Mechanical Systems, 205, MEMS 2005, 18th IEEE International Conference on Miami Beach, FL, USA, Jan. 30-Feb. 3, 2005, Piscataway, NJ, USA, IEEE Jan. 30, 2005, pp. 22-226.

* cited by examiner

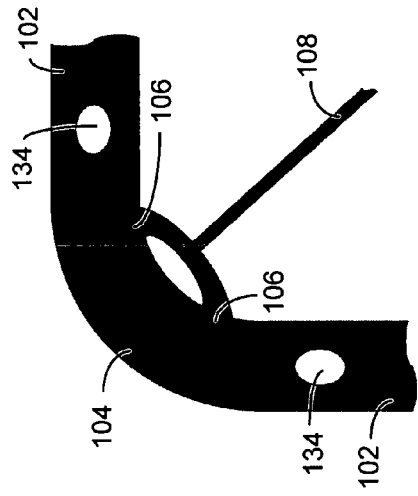
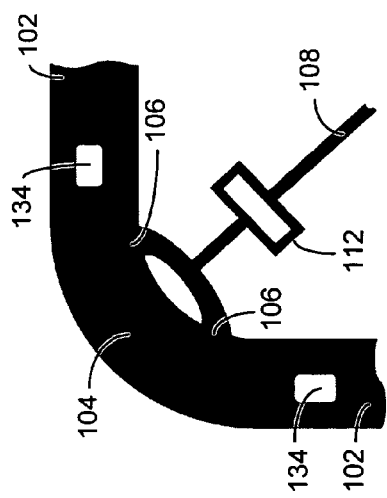
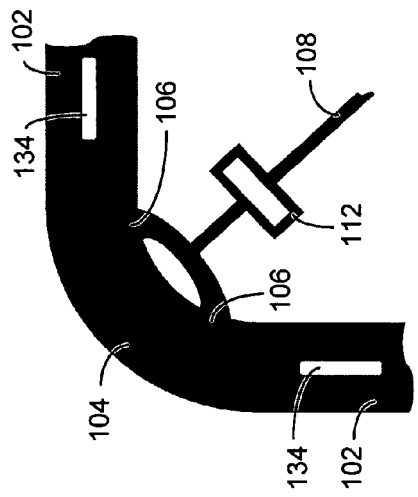
FIGURE 36
FIGURE 35
FIGURE 37

MICROELECTROMECHANICAL RESONATOR STRUCTURE, AND METHOD OF DESIGNING, OPERATING AND USING SAME

BACKGROUND

This invention relates to a microelectromechanical or nanoelectromechanical resonator architecture or structure, and method of designing, operating, controlling and/or using such a resonator; and more particularly, in one aspect, to a microelectromechanical or nanoelectromechanical resonator architecture or structure having one or more enhanced nodal points that facilitate substrate anchoring in order to minimize influence of packaging stress and/or energy loss via substrate anchoring.

Generally, high Q microelectromechanical resonators are regarded as a promising choice for integrated single chip frequency references and filter. In this regard, high Q microelectromechanical resonators tend to provide high frequency outputs that are suitable for many high frequency applications requiring compact and/or demanding space constrained designs. However, when the output frequency of the resonator is "pushed" higher while the resonator is being scaled smaller, packaging stress, energy loss into the substrate through substrate anchors and/or instability or movement of the center of gravity during oscillation tend to adversely impact the frequency stability as well as "Q" of the resonator.

There are several well-known resonator architectures. For example, one group of conventional resonator architectures employs closed-ended or open-ended tuning fork. For example, with reference to FIG. 1, closed-ended or double-clamped tuning fork resonator 10 includes beams or tines 12a and 12b. The beams 12a and 12b are anchored to substrate 14 via anchors 16a and 16b. The fixed electrodes 18a and 18b are employed to induce a force to beams 12a and 12b to cause the beams to oscillate (in-plane).

The characteristics and response of tuning fork resonator 10 are well known. However, such resonator architectures are often susceptible to changes in mechanical frequency of resonator 10 by inducing strain into resonator beams 12a and 12b as a result of packaging stress. In addition, conventional resonator architectures, like that illustrated in FIG. 1, experience or exhibit energy loss, though the anchors, into the substrate.

Certain architectures and techniques have been described to address Q-limiting loss mechanism of energy loss into the substrate through anchors as well as changes in frequency due to certain stresses. For example, the beams may be "suspended" above the ground plane and sense electrode whereby the vibration mode of the beam is out-of-plane. (See, for example, U.S. Pat. No. 6,249,073). While such architectures may alleviate energy loss through the anchors, resonators that include an out-of-plane vibration mode (i.e., transverse mode) tend to exhibit relatively large parasitic capacitance between drive/sense electrodes and the substrate. Such capacitance may lead to a higher noise floor of the output signal (in certain designs).

In addition, such a resonator requires at least one additional mask to fabricate, as compared to the in-plane vibration resonator, in order to define the drive/sense electrode. Notably, conventional resonator architectures implementing the "suspended" beam configuration remains susceptible to a "moving" center of gravity during oscillation which may adversely impact the frequency stability as well as "Q" of the resonator Other techniques to improve the Q-factor of the resonator have been proposed and include designing the spacing between the vibrating beams so that such beams are closely spaced relative to a wavelength associated with their vibrating frequency. (See, for example, the single-ended or single-clamped resonator of U.S. Pat. No. 6,624,726). The vibrating beams are driven to vibrate one-half of a vibration period out of phase with each other (i.e., to mirror each others motion). While these architectures and techniques to improve the Q of the resonator may suppress acoustic energy leakage, such an architecture remain predisposed to packaging stress, energy loss into the substrate through substrate anchors as well as a "moving" of the center of gravity of the resonator during motion by the vibrating beams of the single-ended or single-clamped resonator.

Thus, there is a need for a resonator architecture, configurations or structure, and method of designing, operating, controlling and/or using such a resonator that overcomes the shortcomings of one, some or all of the conventional microelectromechanical resonator architectures, configurations or structures. In this regard, there is a need for improved microelectromechanical and/or nanoelectromechanical resonators having improved packaging stress characteristics, reduced and/or minimal energy loss into the substrate though substrate anchors, and/or improved or optimal stability of the center of gravity during oscillation. In this way, the stability and/or linearity of the output frequency of the resonator is enhanced and/or the "Q" factor of the resonator is high.

SUMMARY OF THE INVENTION

There are many inventions described and illustrated herein, as well as many aspects and embodiments of those inventions. In a first principal aspect, a microelectromechanical resonator structure comprises a plurality of elongated straight beam sections, and a plurality of curved sections, wherein at least one curved section includes a nodal point. Each end of a beam section is connected to an associated end of one of the curved sections to thereby form a geometric shape (for example, a rounded triangle shape, a rounded square shape, a rounded rectangle, a rounded pentagon, a rounded hexagon shape or rounded octagon shape). The resonator structure also includes at least one anchor coupling section and a substrate anchor, coupled to the nodal point via the anchor coupling section, to secure the resonator structure to a substrate. In one embodiment, the microelectromechanical resonator structure further includes a stress/strain relief mechanism coupled between the substrate anchor and the nodal point.

In one embodiment, each curved section includes at least one nodal point. In this embodiment, the substrate anchor is coupled to the at least one nodal point of each curved section. The resonator structure may include a plurality of stress/strain relief mechanisms coupled between the substrate anchor and each nodal point of the at least one nodal point of each curved section. Indeed, the substrate anchor may include a plurality of anchors and wherein the at least one nodal point of each curved section is coupled to at least one of the plurality of anchors to secure the resonator structure to a substrate. A plurality of stress/strain relief mechanisms coupled between each anchor and the at least one nodal point of each curved section. One of the plurality of elongated straight beam sections and/or one of the plu rality of curved sections includes a plurality of slots disposed therein.

In another embodiment, the width of each elongated straight beam section of the plurality of elongated straight beam sections is greater at the ends than in the center thereof. In addition thereto or in lieu thereof, the plurality of elongated straight beam sections are filleted at the ends thereof.

In a second principal aspect, the microelectromechanical resonator structure comprises a plurality of elongated straight beam sections and a plurality of curved sections, wherein each curved section includes a nodal point. Each end of a beam section is connected to an associated end of one of the curved sections to thereby form a geometric shape (for example, a rounded triangle shape, a rounded square shape, a rounded rectangle, a rounded pentagon, a rounded hexagon shape or rounded octagon shape). The microelectromechanical resonator structure of this aspect includes a plurality of anchor coupling sections and a substrate anchor, coupled to the nodal points of each curved section via the plurality of anchor coupling sections, to secure the resonator structure to a substrate.

The microelectromechanical resonator structure may also include a plurality of stress/strain relief mechanisms, wherein each stress/strain relief mechanism is coupled between the substrate anchor and an associated nodal point.

In one embodiment, the substrate anchor may include a plurality of anchors wherein the at least one nodal point of each curved section is coupled to at least one of the plurality of anchors to secure the resonator structure to a substrate. The microelectromechanical resonator structure may include a plurality of stress/strain relief mechanisms coupled between an associated anchor of the plurality of anchors and an associated nodal point of the at least one nodal point of each curved section.

Notably, the nodal point of each curved section is located on an inner portion of the curved section and/or an outer portion of the curved section.

In one embodiment, the plurality of elongated straight beam sections and/or the plurality of curved sections may include a plurality of slots disposed therein.

In yet another aspect, microelectromechanical resonator structure comprises a plurality of elongated straight beam sections and a plurality of curved sections, wherein each curved section includes at least one nodal point (for example, located at an inner portion and/or outer portion of the curved section). Each end of a beam section is connected to an associated end of one of the curved sections to thereby form a geometric shape (for example, a rounded triangle shape, a rounded square shape, a rounded rectangle, a rounded pentagon, a rounded hexagon shape or rounded octagon shape). The microelectromechanical resonator structure may also include a substrate anchor, coupled to at least one nodal point of each curved section, to secure the resonator structure to a substrate. In this aspect, the microelectromechanical resonator structure includes a plurality of sense electrodes and a plurality of drive electrodes, wherein the sense and drive electrodes are juxtaposed the plurality of elongated straight beam sections such that sense electronics provide an output signal (for example, a single ended output or a differential output).

The microelectromechanical resonator structure may include a plurality of stress/strain relief mechanisms, wherein each stress/strain relief mechanism is coupled between the substrate anchor and an associated nodal point.

In one embodiment, the substrate anchor includes a plurality of anchors and wherein the at least one nodal point of each curved section is coupled to at least one of the plurality of anchors to secure the resonator structure to a substrate. In this embodiment, the structure may also include a plurality of stress/strain relief mechanisms coupled between an associated anchor of the plurality of anchors and an associated nodal point of the at least one nodal point of each curved section.

In one embodiment, the plurality of elongated straight beam sections and/or the plurality of curved sections may include a plurality of slots disposed therein.

Again, there are many inventions, and aspects of the inventions, described and illustrated herein. This Summary of the Invention is not exhaustive of the scope of the present inventions. Moreover, this Summary of the Invention is not intended to be limiting of the invention and should not be interpreted in that manner. While certain embodiments have been described and/or outlined in this Summary of the Invention, it should be understood that the present invention is not limited to such embodiments, description and/or outline. Indeed, many others embodiments, which may be different from and/or similar to, the embodiments presented in this Summary, will be apparent from the description, illustrations and claims, which follow. In addition, although various features, attributes and advantages have been described in this Summary of the Invention and/or are apparent in light thereof, it should be understood that such features, attributes and advantages are not required whether in one, some or all of the embodiments of the present inventions and, indeed, need not be present in any of the embodiments of the present invention.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 25–37 are top views of embodiments of a microelectromechanical resonator (or portions thereof) according to an aspect of the invention, wherein the microelectromechanical resonator device includes openings, voids or slots for improved manufacturability (for example, faster release of the mechanical structure in those instances where the opening, void or slot extends the entire height/thickness of the beam section) and/or to improve temperature management techniques (for example, decrease thermo elastic energy dissipation) implemented in one or more elongated beam sections and/or one or more curved sections;

DETAILED DESCRIPTION

Figure 1:
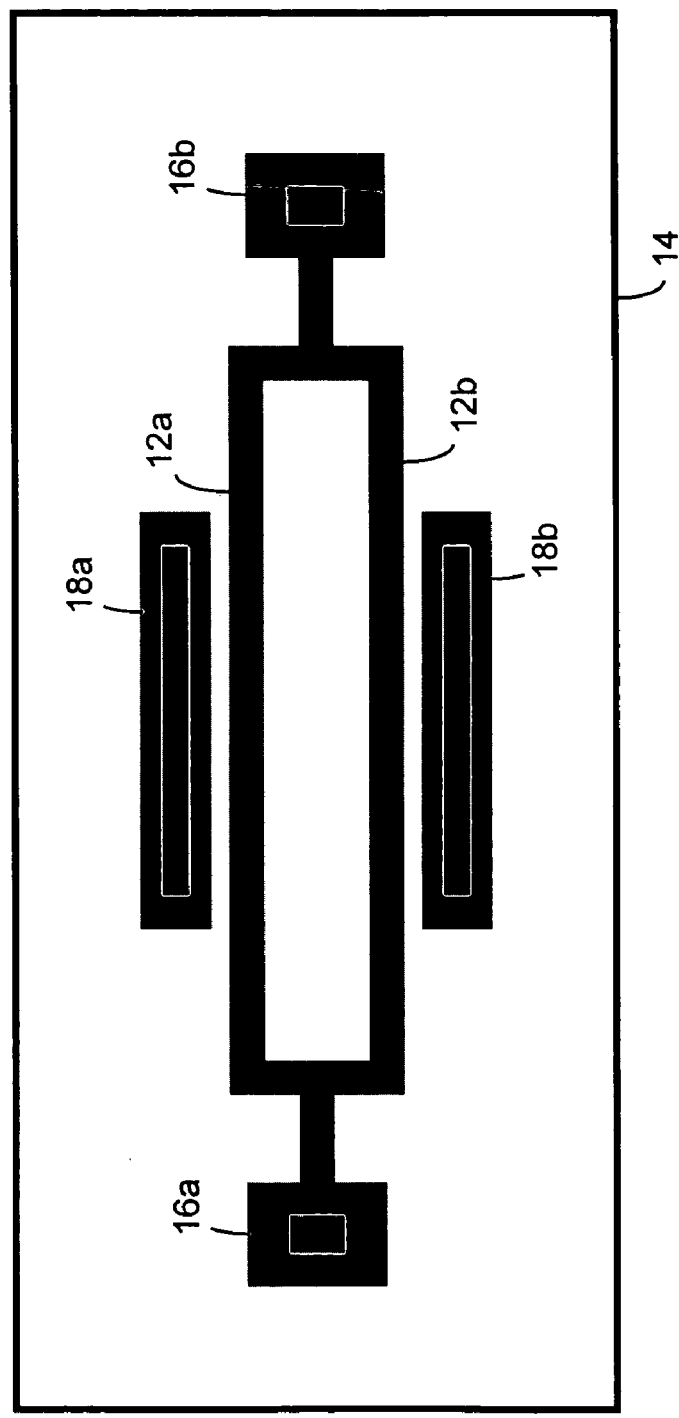
FIG. 1 is a schematic block diagram representation of a conventional microelectromechanical tuning fork resonator device.

There are many inventions described and illustrated herein, as well as many aspects and embodiments of those inventions. In one aspect, the present invention is directed to a resonator architecture or structure including a plurality of straight (or substantially straight) elongated beam sections that are connected by curved or rounded sections. Each elongated beam section is connected to another elongated beam section at a distal end via the curved or rounded sections thereby forming a geometric shape having at least two elongated beam sections that are interconnected via curved or rounded sections. For example, in one embodiment, the microelectromechanical resonator structure of the present invention includes three elongated beam sections that are interconnected via curved sections to form a rounded triangle shape. In another embodiment, the present invention includes four straight (or substantially straight) elongated beams that are connected, at distal ends, to rounded sections thereby forming a rounded square or rectangle shape.

In operation, when induced, the microelectromechanical resonator structure oscillates in a combined elongating (or breathing) mode and bending mode. In this regard, the beam sections exhibit an elongating-like (or breathing-like) motion and a bending-like motion. The beam sections oscillate or vibrate at the same frequency.

The design and motion of the resonator structure is such that the structure includes one or more nodal points or areas (i.e., portions of the resonator structure that are stationary, experience little movement, and/or are substantially stationary in one or more degrees of freedom (whether from a rotational and/or translational perspective) during oscillation of the resonator structure). The nodal points are located in one or more portions or areas of the curved sections of the resonator structure. The nodal points are suitable and/or preferable locations to anchor the resonator structure to the substrate. In this way, energy loss into the substrate may be minimized, limited and/or reduced, thereby enhancing the Q-factor of the structure. Notably, such a configuration may minimize and/or reduce communication of stress and/or strain between the resonating beams of the resonator structure and the substrate.

In addition, although the beam sections, when induced or during operation, move in an elongating-like (or breathing-like) manner (for example, like that of a ring oscillator) and a bending-like manner (for example, like that of a beam of a double-claimed tuning fork), the resonator structure tends to maintain a relatively stable or fixed center of gravity. In this way, the structure may avoid energy loss and thereby provide a resonator structure having a higher Q-factor.

Notably, the present inventions are described in the context of microelectromechanical systems. The present inventions, however, are not limited in this regard. Rather, the inventions described herein are applicable to, for example, nanoelectromechanical systems. Thus, the present inventions are pertinent to microelectromechanical and nanoelectromechanical systems (hereinafter collectively "MEMS" unless specifically noted to the contrary), for example, gyroscopes, resonators, and/or accelerometers, implementing one or more of the resonator architectures of the present inventions.

Figure 2A:
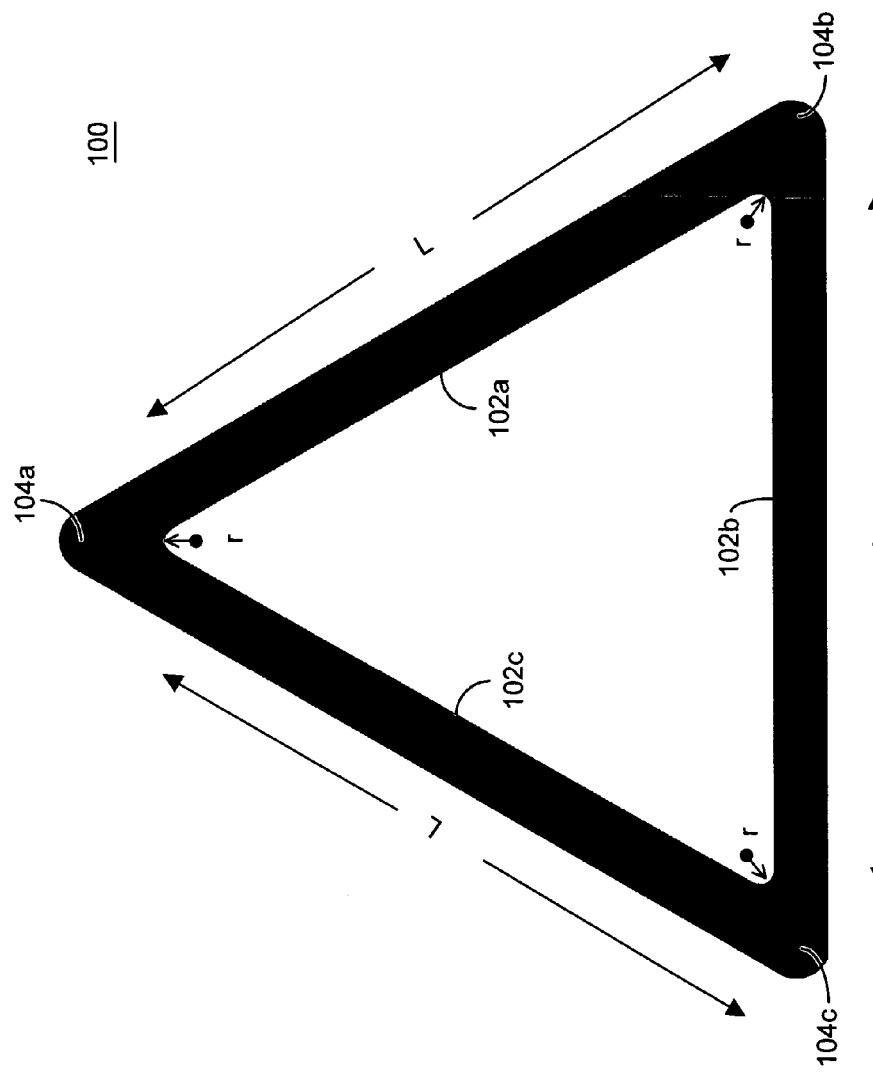
FIG. 2A is a top view of one embodiment of a rounded triangle shaped microelectromechanical resonator having three elongated beam sections that are connected via rounded or curved sections, according to one embodiment of one aspect of present invention.
Figure 2B:
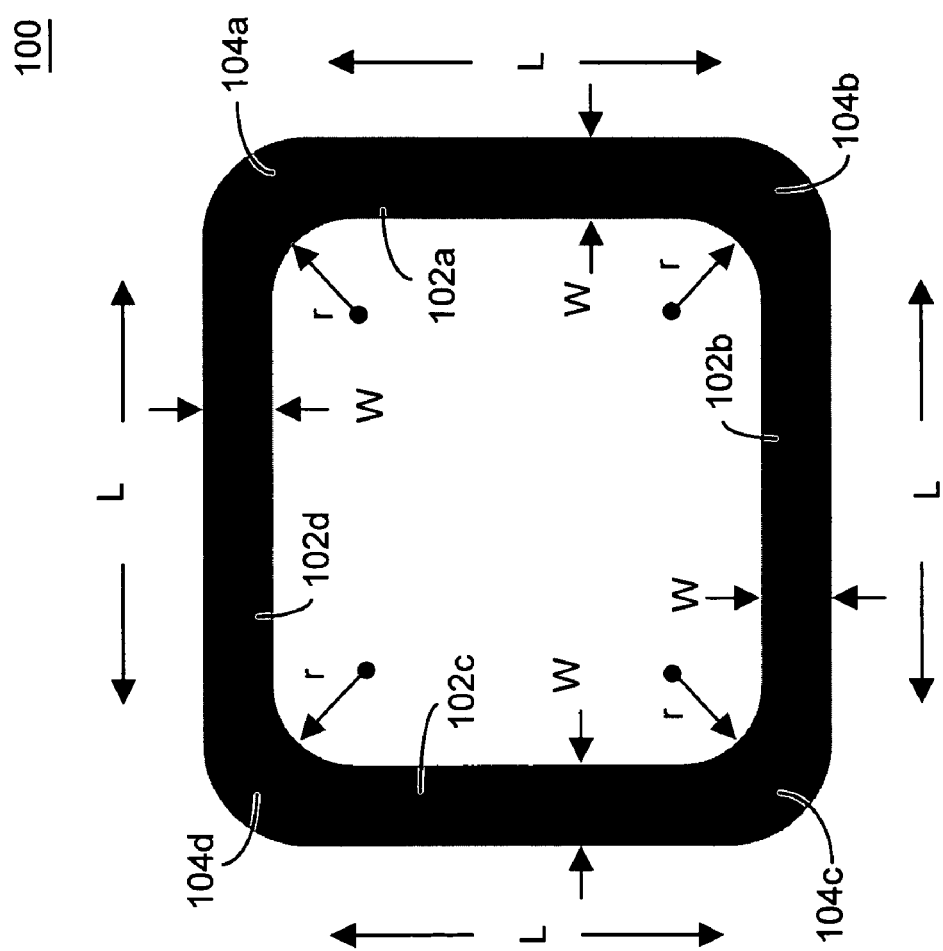
FIG. 2B is a top view of one embodiment of a rounded square shaped microelectromechanical resonator having four elongated beam sections that are connected via rounded or curved sections, according to one embodiment of one aspect of present invention.

As mentioned above, the resonator structure of the present invention includes a plurality of elongated beam sections that are connected by curved or rounded sections. The elongated beam sections may be connected to another beam section at each distal end via the curved or rounded sections thereby forming a geometric shape having at least two elongated beams that are interconnected via curved or rounded sections. In one embodiment, with reference to FIG. 2A, MEMS resonator 100 includes three elongated beam sections 102a–c that are connected via curved sections 104a–c to form a rounded triangle shape. With reference to FIG. 2B, in another embodiment, MEMS resonator 100 includes four elongated beam sections 102a–d that are connected via curved sections 104a–d to form a rounded square or rectangle shape.

Figure 2C:
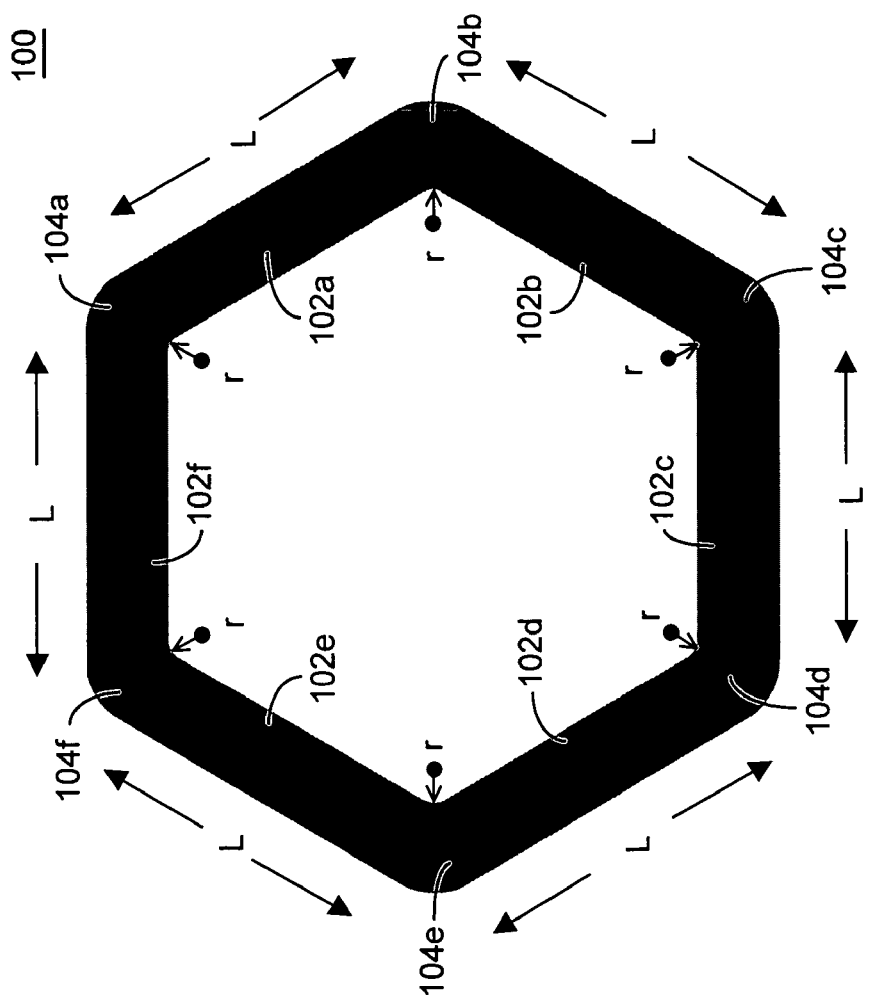
FIG. 2C is a top view of one embodiment of a rounded hexagon shaped microelectromechanical resonator having six elongated beam sections that are connected via rounded or curved sections, according to one embodiment of one aspect of present invention.
Figure 2D:
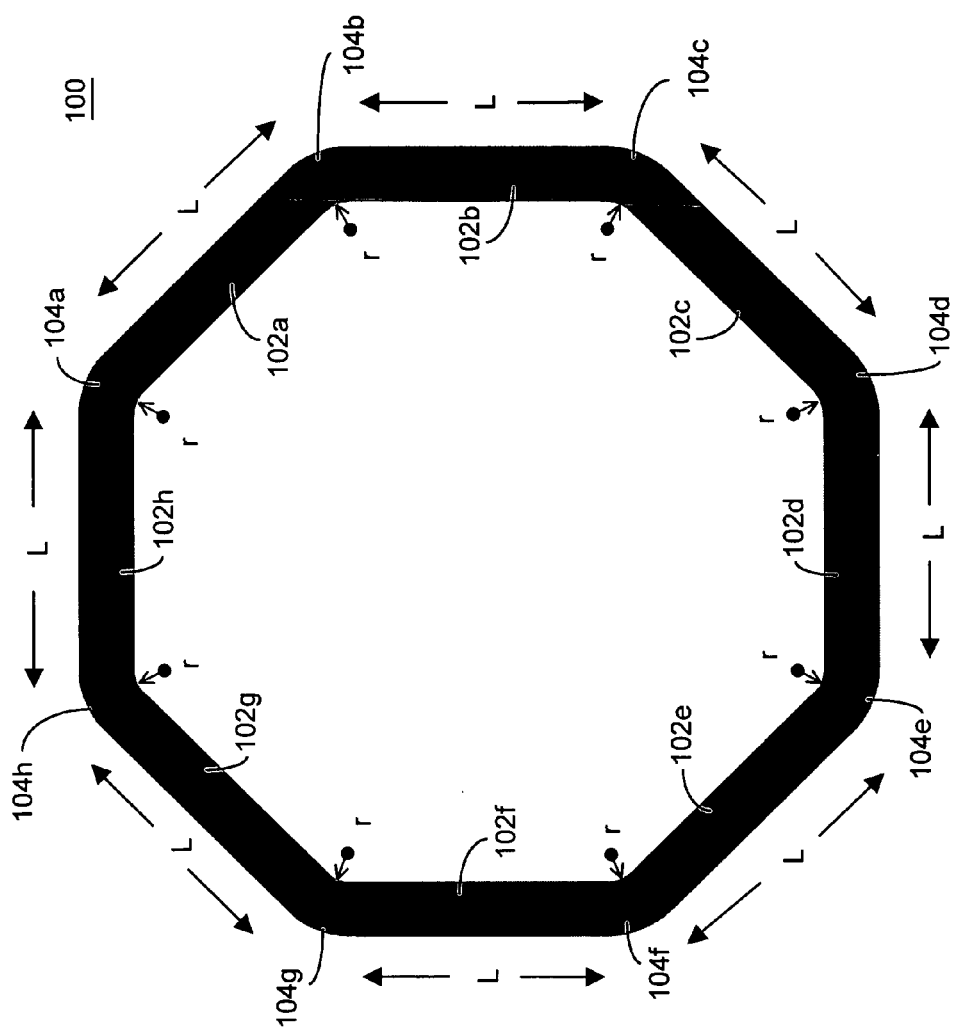
FIG. 2D is a top view of one embodiment of a rounded octagon shaped microelectromechanical resonator having eight elongated beam sections that are connected via rounded or curved sections, according to one embodiment of one aspect of present invention.
Figure 3:
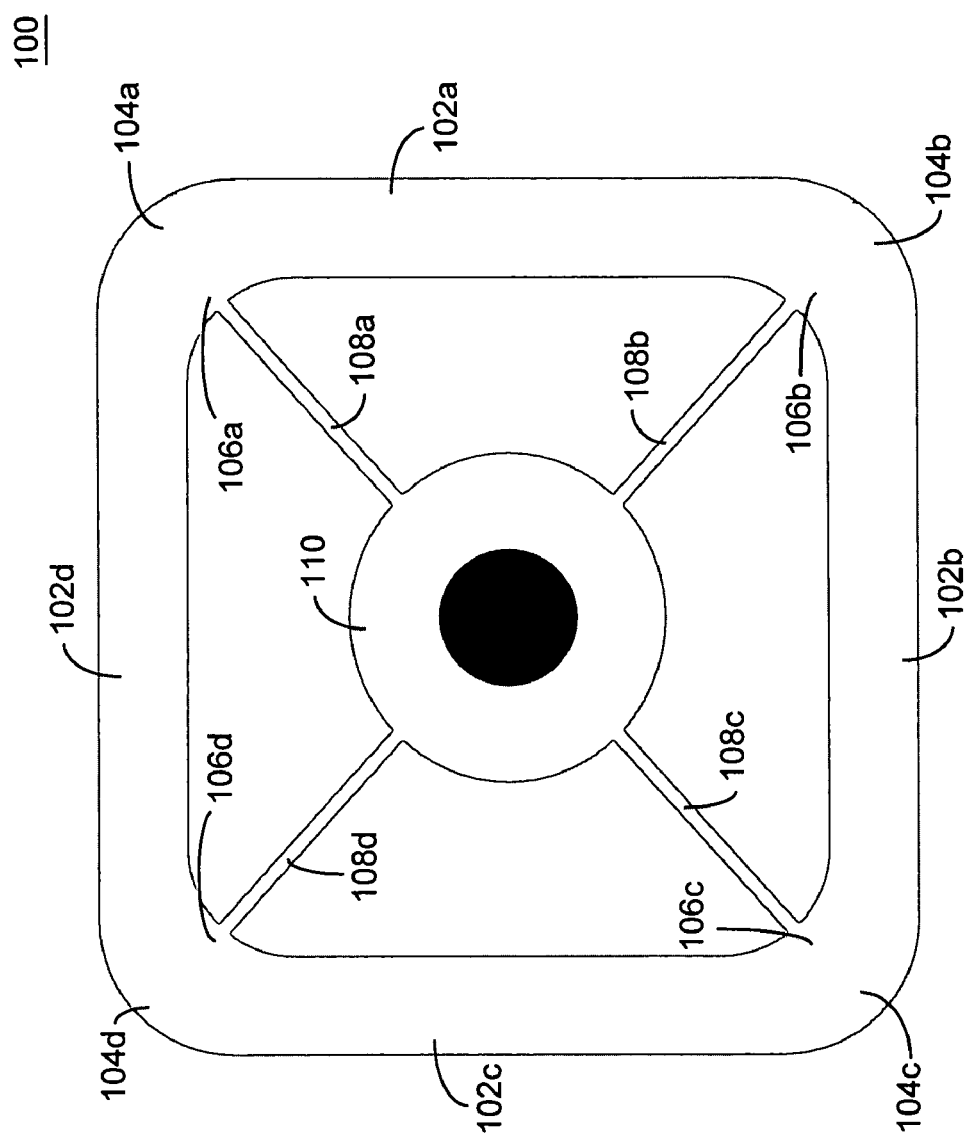
FIGS. 3–7 illustrate top views of a rounded square shaped microelectromechanical resonators according to certain embodiments of present inventions wherein the square-like shaped microelectromechanical resonators are anchored to the substrate using various anchoring techniques and/or configurations.

Notably, MEMS resonator 100 of the present inventions may include more than four elongated beam sections, for example, MEMS resonator 100 may include six elongated beam sections 102a–f that are connected together via curved sections 104a–f to form a rounded hexagon shape (see, FIG. 2C), or eight elongated beam sections 102a–h that are connected together via curved sections 104a–h to form a rounded octagon shape (see, FIG. 2D). Indeed, the resonator structure of the present inventions may take any geometric shape whether now know or later developed that includes two or more straight elongated beam sections which are interconnected by two or more curved or rounded sections.

The length and width of each beam section 102 and inner radii of the curved sections 104 (and/or, more generally the shape of the radii of the curved sections) may determine one or more resonant frequencies of MEMS resonator 100. The beam sections 102 oscillate or vibrate at the same frequency. TABLE 1 provides a resonant frequency in conjunction with exemplary dimensions of the length and width of each beam section 102 and inner radii of the curved sections 104 of rounded square MEMS resonator 100 which is fabricated from a polycrystalline silicon material. Notably, in these exemplary embodiments, the width of elongated beam sections 102 and curved sections 104 are the same or substantially the same.

TABLE 1

| | Elongated Beam Section | | Curved Section | Resonant Frequency |
|---|---|---|---|---|
| | Width (μm) | Length (μm) | Inner Radius (μm) | (MHz) |
| Example 1 | 24 | 122.43 | 34.787 | 5.3034 |

TABLE 2 provides a resonant frequency in conjunction with exemplary dimensions of the length and width of each beam section 102 and inner radii of the curved sections 104 of a rounded square MEMS resonator 100 which is fabricated from a monocrystalline silicon material. Again, in these exemplary embodiments, the width of elongated beam sections 102 and curved sections 104 are the same or substantially the same.

TABLE 2

| | Elongated Beam Section | | Curved Section | Resonant Frequency |
|---|---|---|---|---|
| | Width (μm) | Length (μm) | Inner Radius (μm) | (MHz) |
| Example 1 | 8 | 209.61 | 7.1944 | 1.1903 |
| Example 2 | 24 | 129.89 | 31.055 | 4.8286 |

Notably, the dimensions of the MEMS resonators set forth in Tables 1 and 2 are merely exemplary. The dimensions, characteristics and/or parameters of a MEMS resonator according to the present invention may be determined using a variety of techniques including modeling and simulation techniques (for example, a finite element modeling and/or simulation process implemented via a computer driven analysis engine, such as FemLab (from Consol), ANSYS (ANSYS INC.), IDEAS and/or ABAKUS) and/or empirical data/measurements. For example, a finite element analysis engine, using or based on a set of boundary conditions (for example, the size of the resonator structure), may be employed to determine and assess the dimensions, characteristics and/or parameters of (i) elongated beam sections 102, (ii) curved sections 104, and (iii) other elements or properties of the resonator structure that are discussed below.

As mentioned above, in operation, the motion of the MEMS resonator is such that the structure includes one or more nodal points (i.e., areas or portions of the resonator structure that do not move, experience little movement, and/or are substantially stationary when the structure oscillates). It may be advantageous to anchor the MEMS resonator to the substrate through or at one or more of the one or more nodal points. With reference to FIGS. 3–6, nodal points 106a–d may be located in or near one or more of curved sections 104 of MEMS resonator 100. For example, with reference to FIG. 3, in one embodiment, MEMS resonator 100 includes nodal points 106a–d located on or near an inner area, portion or region of curved sections 104. The anchor coupling sections 108a–d are connected at or near nodal points 106a–d, respectively, in order to secure, fix and/or connect MEMS resonator 100 to the substrate via anchor 110. In this embodiment, MEMS resonator 100 is coupled to a unitary "center" anchor 110.

Figure 4:
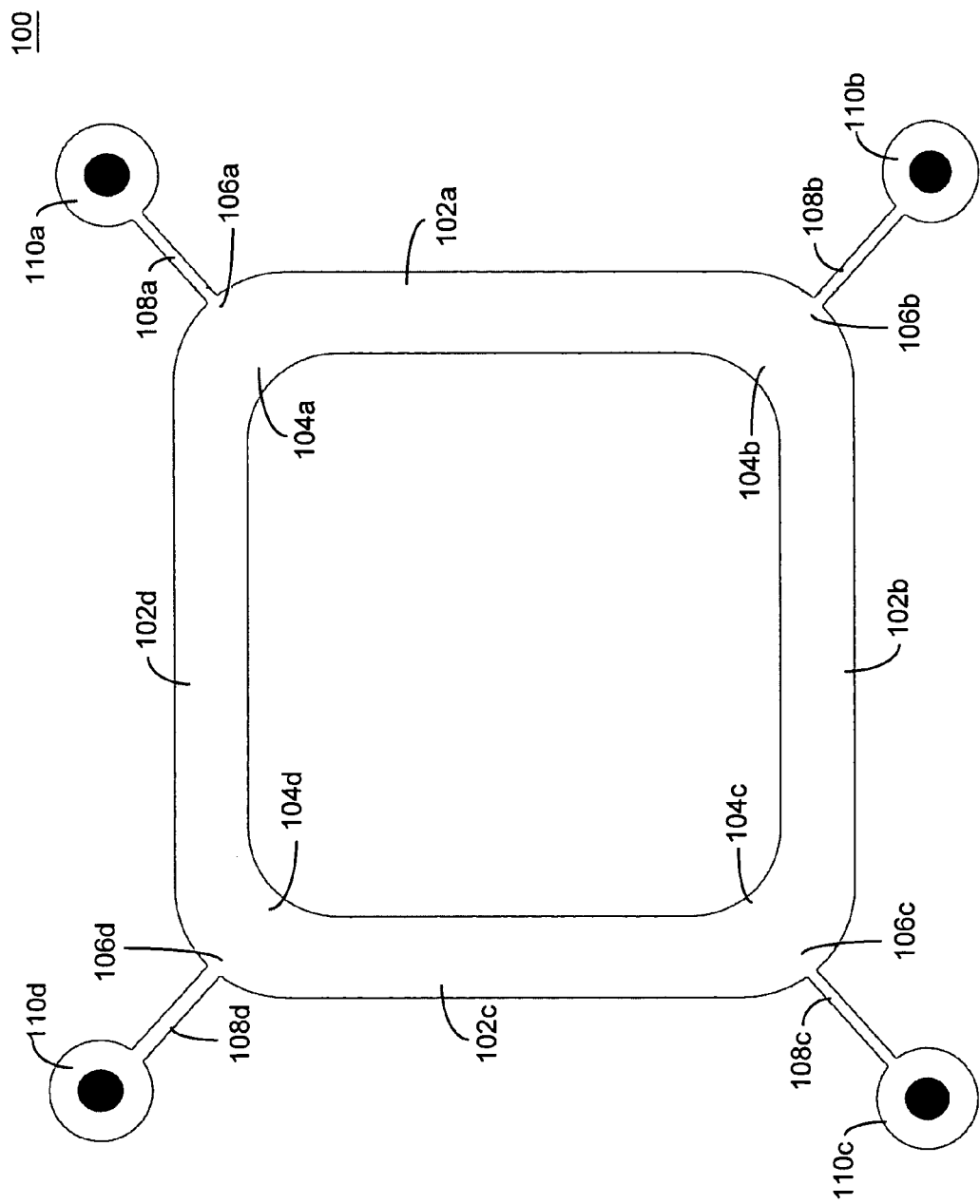

The MEMS resonator 100 may be anchored to the substrate using a variety of anchoring techniques and/or configurations. With reference to FIG. 4, in one embodiment, in lieu of a "center" anchor (illustrated in, for example, FIG. 3), MEMS resonator 100 may be coupled to anchors 110 via anchor coupling sections 108 that extend outward from one or more curved sections 104. In this embodiment, the nodal points 106*a–d* are located on or near an outer region or portion of curved sections 104. As such, with continued reference to FIG. 4, anchor coupling sections 108*a–d* may connect MEMS resonator 100 to substrate anchors 110*a–d*, respectively, which are located "outside" the rounded square shape of device 110. In this anchoring configuration, the outer region or area of curved sections 104 are nodal points 106*a–d* of MEMS resonator 100. Thus, by anchoring MEMS resonator 100 at or near the outer region or portion of curved section 104 (i.e., at or near one or more nodal points 106*a–d*), the vertical and/or horizontal energy losses of MEMS resonator 100 are minimized or reduced.

Figure 5:
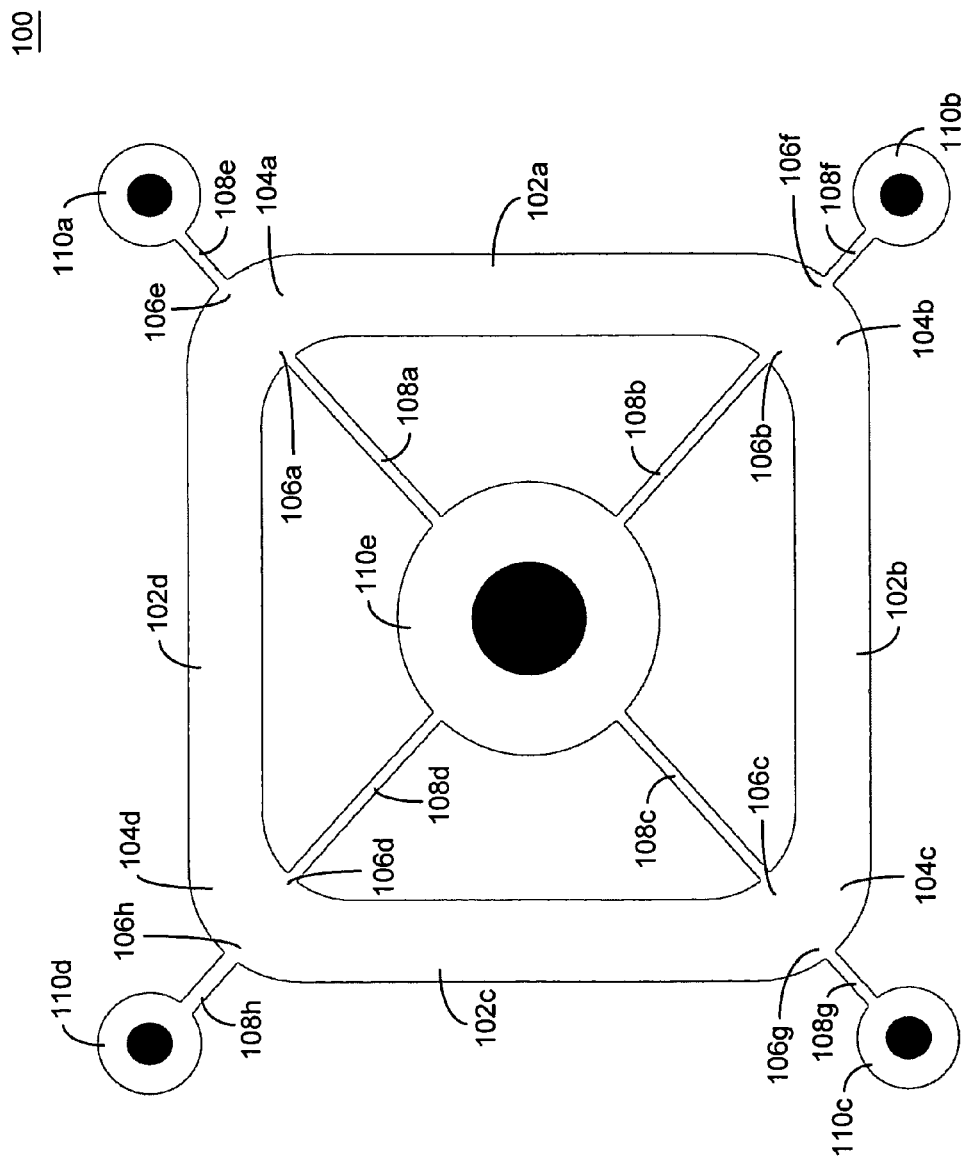

With reference to FIG. 5, in another embodiment, in addition to a "center" anchor configuration (like that illustrated in FIG. 3), MEMS resonator 100 may also be coupled to anchors 110*a–d* via anchor coupling sections 108*e–h*, respectively, that extend outward from one or more curved sections 104. In this embodiment, the nodal points 106*a–h* may be located on or near an inner and an outer region of curved sections 104*a–d*.

Figure 6A:
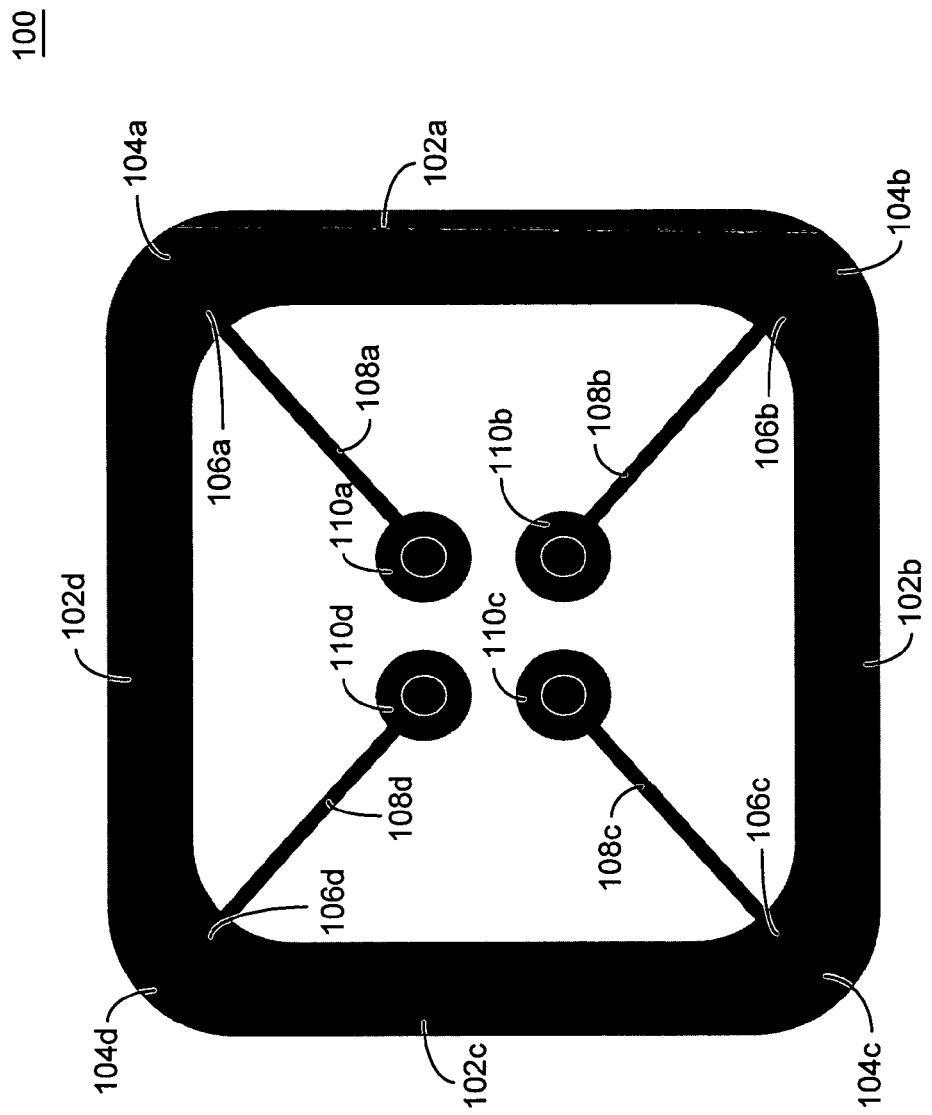
Figure 6B:
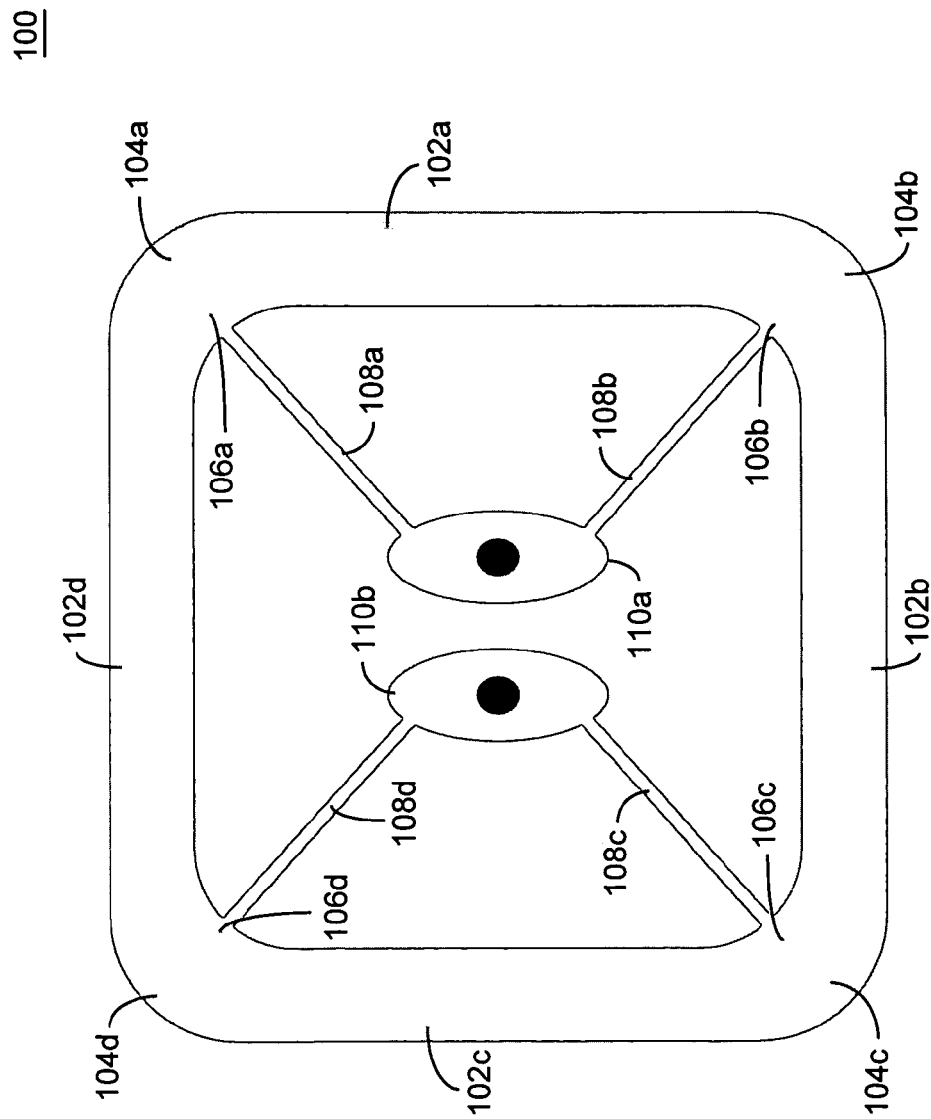
Figure 7A:
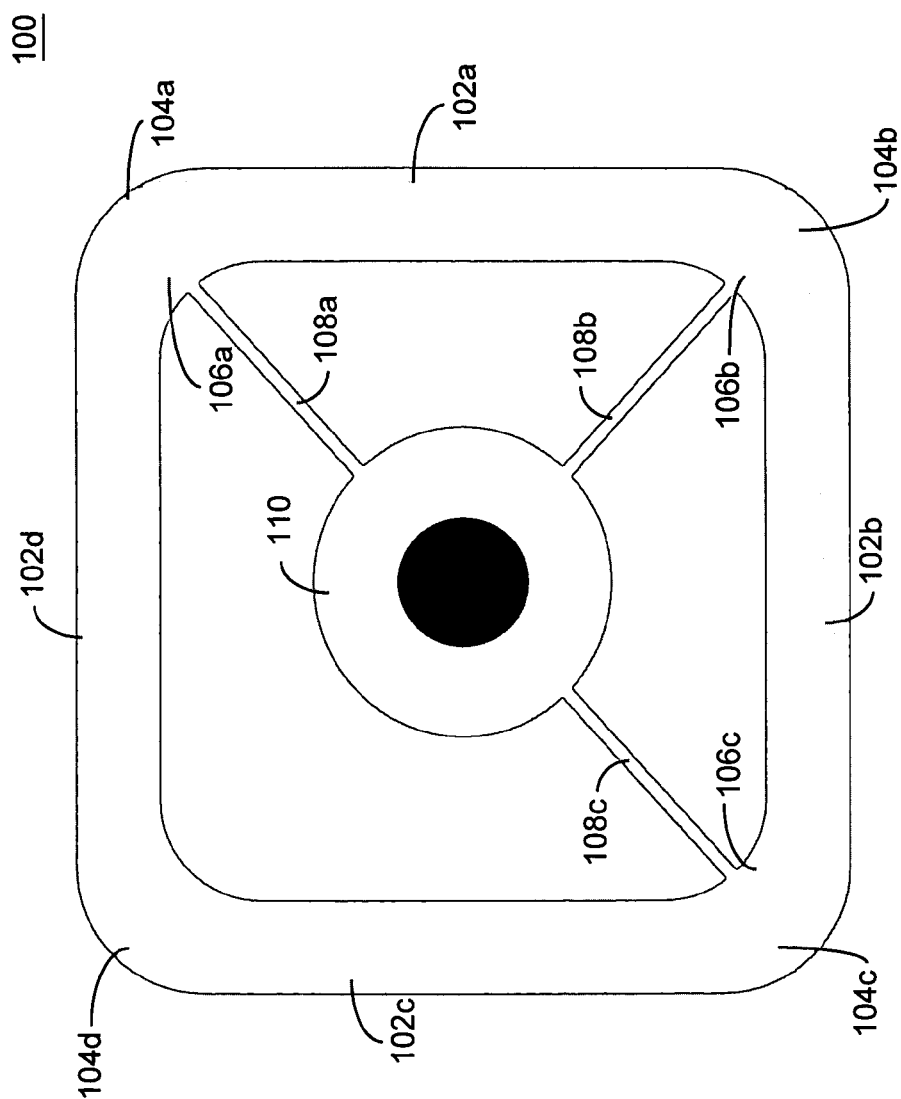
Figure 7B:
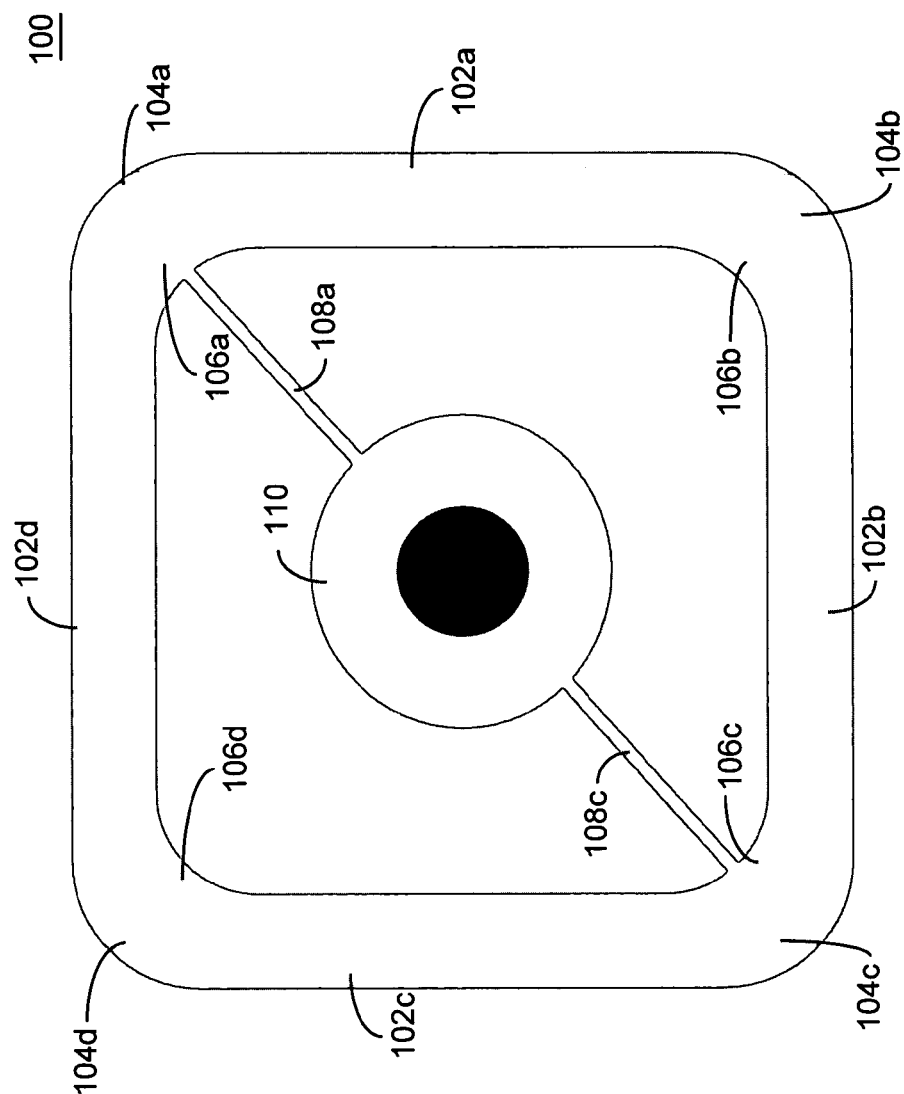
Figure 7C:
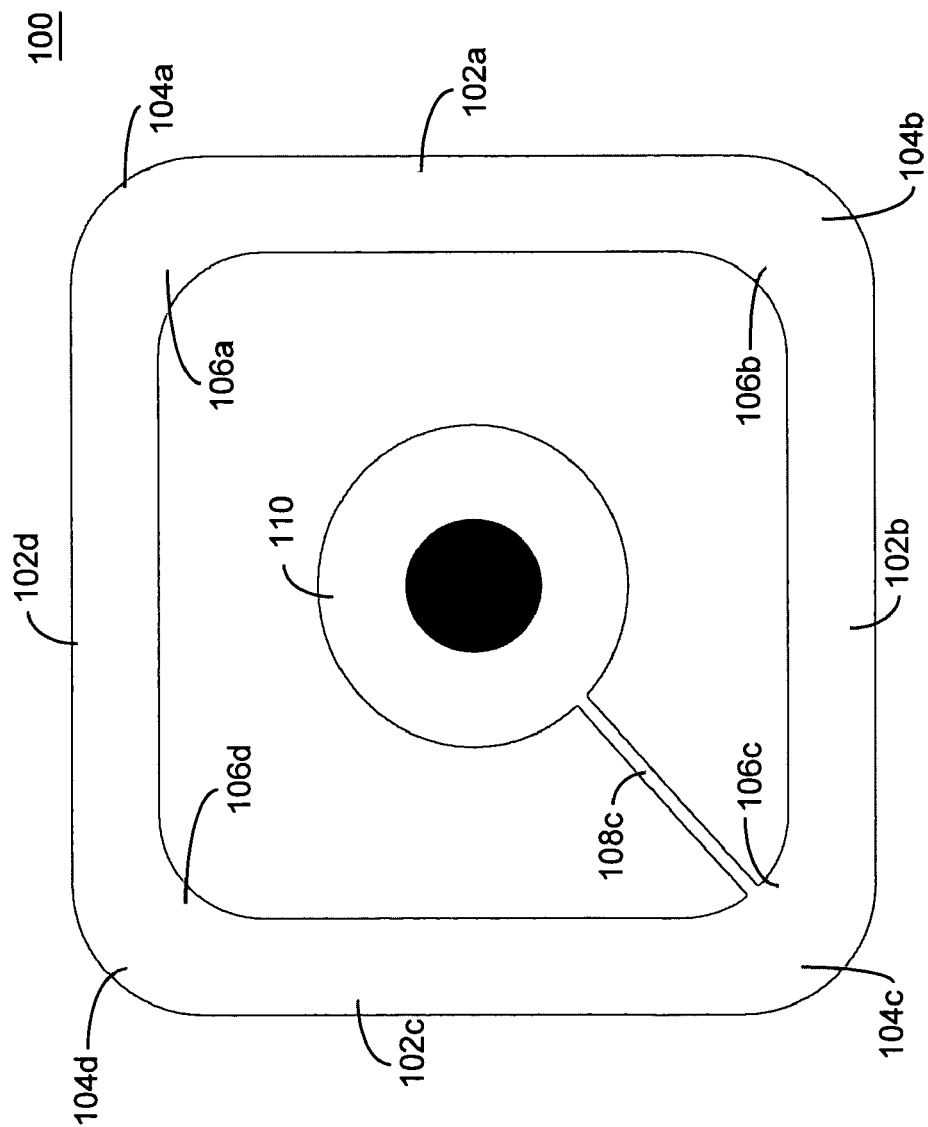
Figure 7D:
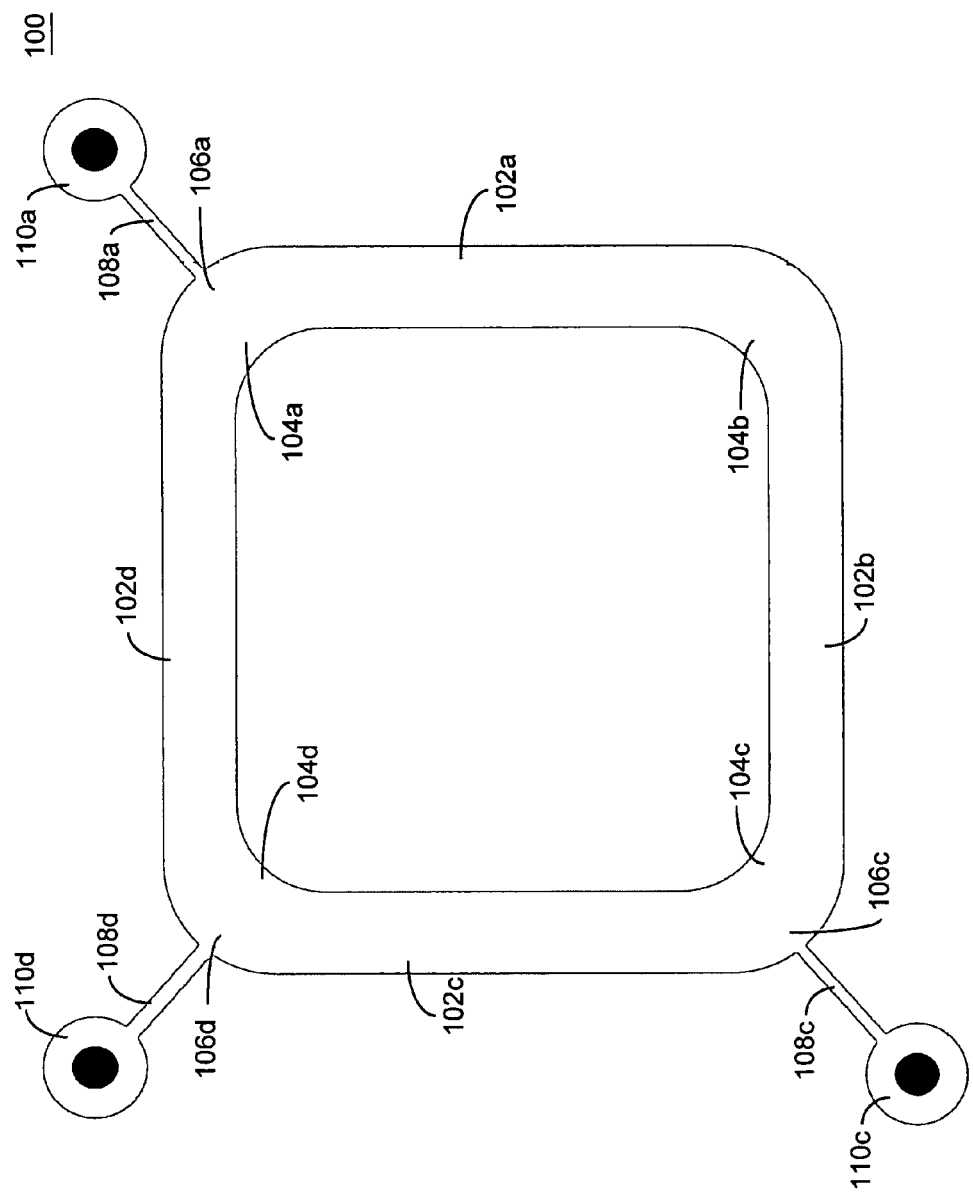
Figure 7E:
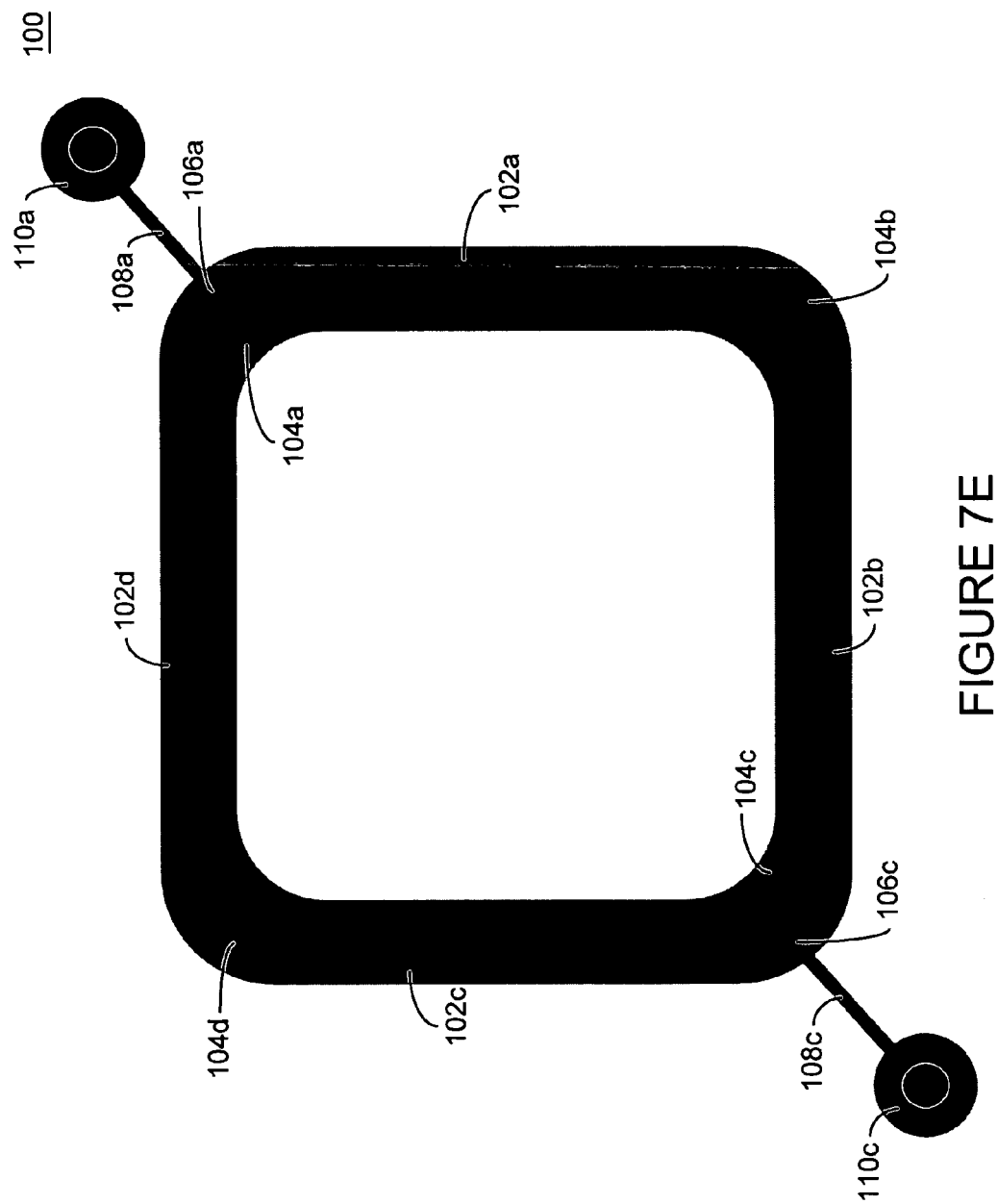
Figure 7F:
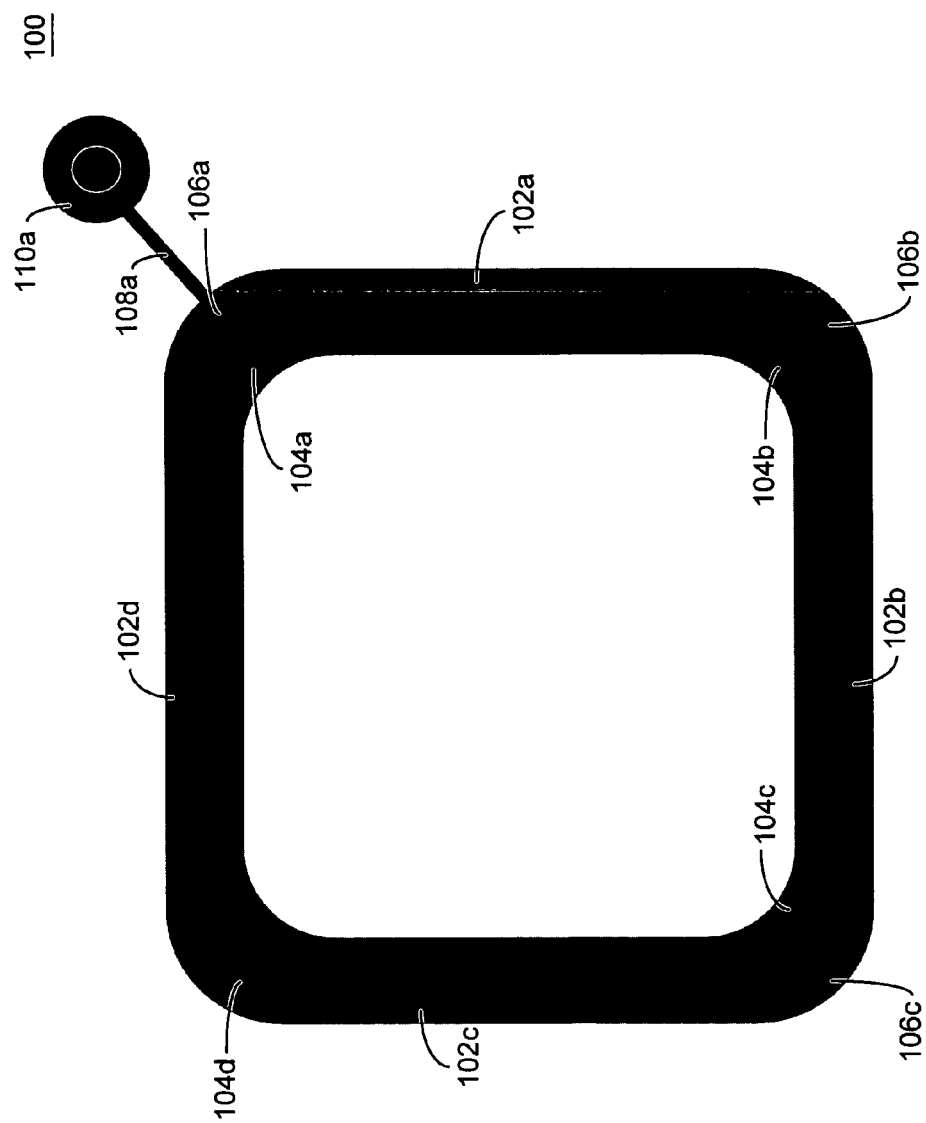

In another embodiment, with reference to FIGS. 6A and 6B, MEMS resonator 100 may be coupled to a "center" anchoring architecture where one or more anchors 110*a–d* (FIG. 6A) or 110*a–b* (FIG. 6B) are distributed and/or dedicated among anchor coupling sections 108*a–d*. In this exemplary embodiment, anchor coupling sections 108*a–d* are connected at or near nodal points 106*a–d* of MEMS resonator 100. In this way, the vertical and/or horizontal energy losses of MEMS resonator 100 are minimized or reduced.

Notably, MEMS resonator 100 need not be anchored at every nodal point or area but may be anchored at one or more locations, preferably at one or more nodal locations (areas or locations of the resonator that do not move, experience little movement, and/or are substantially stationary when the resonator oscillates). For example, with reference to FIGS. 7A–7F, MEMS resonator 100 may be anchored at one point, two points and/or three areas or portions of the resonator structure (preferably, for example, at or near nodal points 106). In this regard, one or more anchor coupling sections 108 connect(s) elongated beam sections 102 and curved section 104 of MEMS resonator 100 to corresponding anchors 110.

A finite element analysis and simulation engine may also be employed to determine and/or define the location(s) of one or more nodal points at which MEMS resonator 100 may be anchored to the substrate with predetermined, minimal and/or reduced energy loss (among other things). In this regard, beam sections 102 of MEMS resonator 100, when induced during operation, move in an elongating (or breathing-like) manner and a bending manner. As such, the length of elongated beam sections 102 and the radii of curved sections 104 may determine the location of nodal points on or in the resonator structure whereby there is little, no or reduced rotation movement due to the elongating (breathing-like) mode, as well as little, no or reduced radial movement due to the bending-like mode. The finite analysis engine may be employed to determine the location of such nodal points in or on MEMS resonator 100 using a given length of elongated beam sections 102, and the shape and/or the radii of curved sections 104 of MEMS resonator 100. In this way, areas or portions in or on curved sections 104 of MEMS resonator 100 that exhibit acceptable, predetermined, and/or little or no movement (radial, lateral and/or otherwise) for anchoring MEMS resonator 100 may be rapidly determined and/or identified.

The MEMS resonator of the present invention may be anchored to the substrate using any technique whether now known or later developed. Indeed, all techniques are intended to fall within the scope of the present invention. For example, the present invention may employ the anchoring techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (hereinafter "Anchors for Microelectromechanical Systems Patent Application"). It is expressly noted that the entire contents of the Anchors for Microelectromechanical Systems Patent Application, including, for example, the features, attributes, alternatives, materials, techniques and advantages of all of the embodiments and/or inventions, are incorporated by reference herein.

Figure 8:
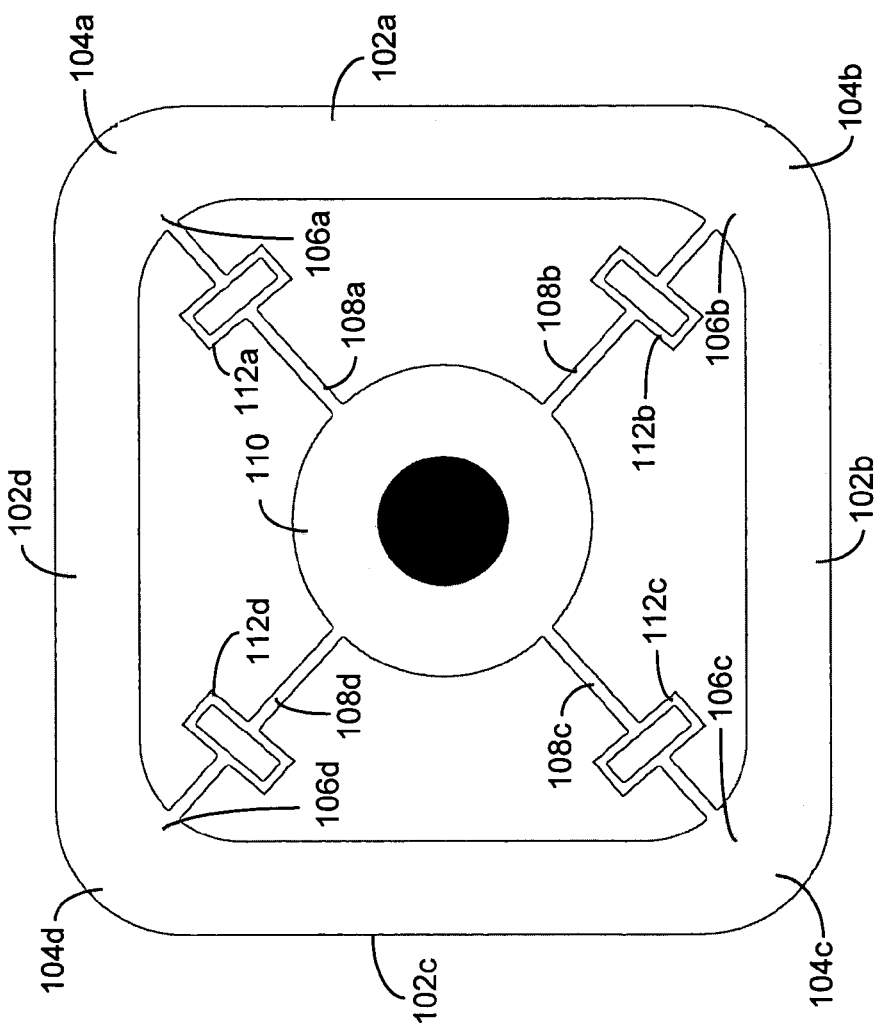
FIGS. 8–10 illustrate top views of a rounded square shaped microelectromechanical resonators according to certain embodiments of present inventions wherein the rounded square shaped microelectromechanical resonators include to stress/strain relief mechanisms which are mechanically coupled between (i) the elongated beam sections and curved sections of the microelectromechanical resonators and (ii) to substrate anchors.
Figure 9:
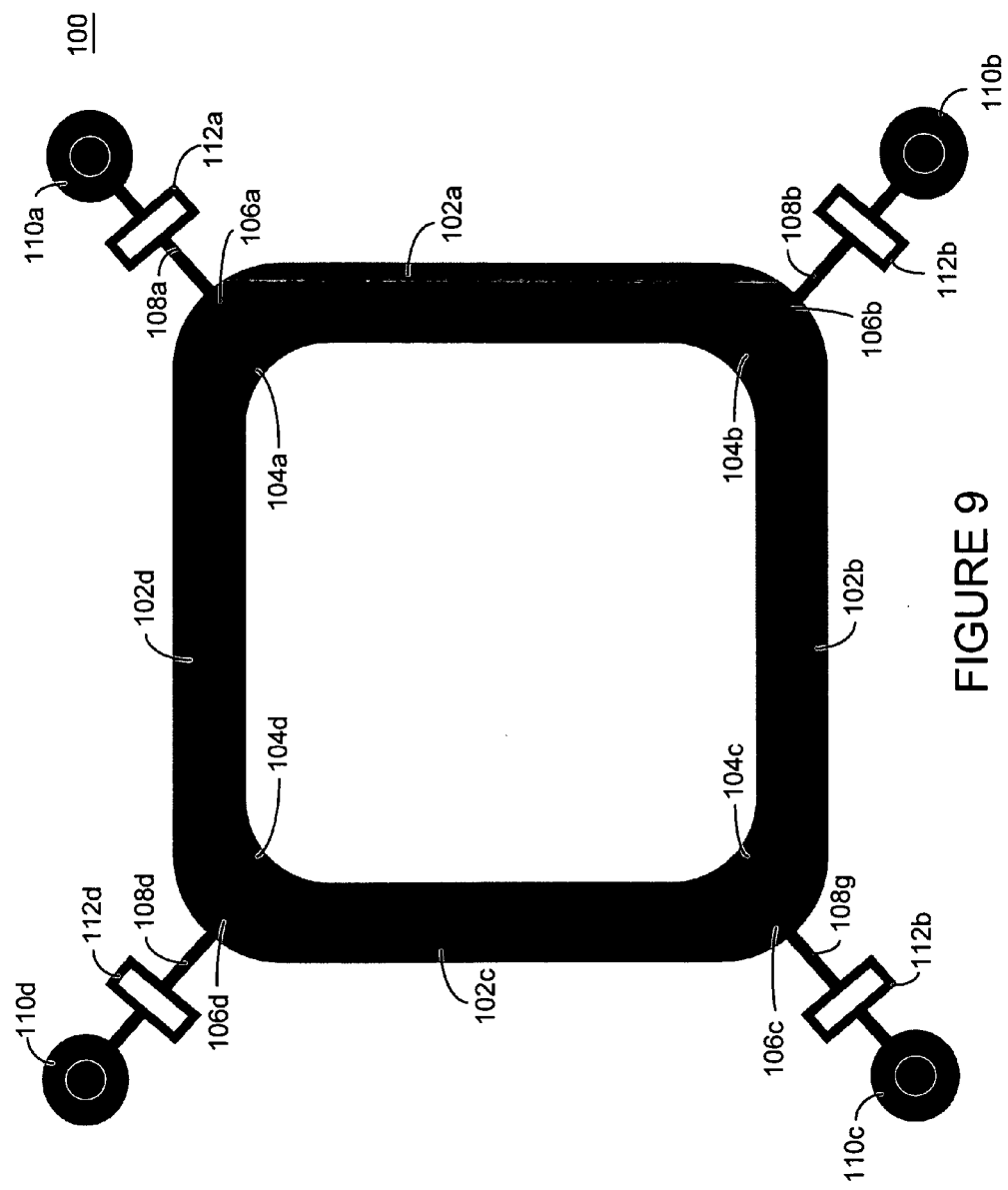
Figure 10:
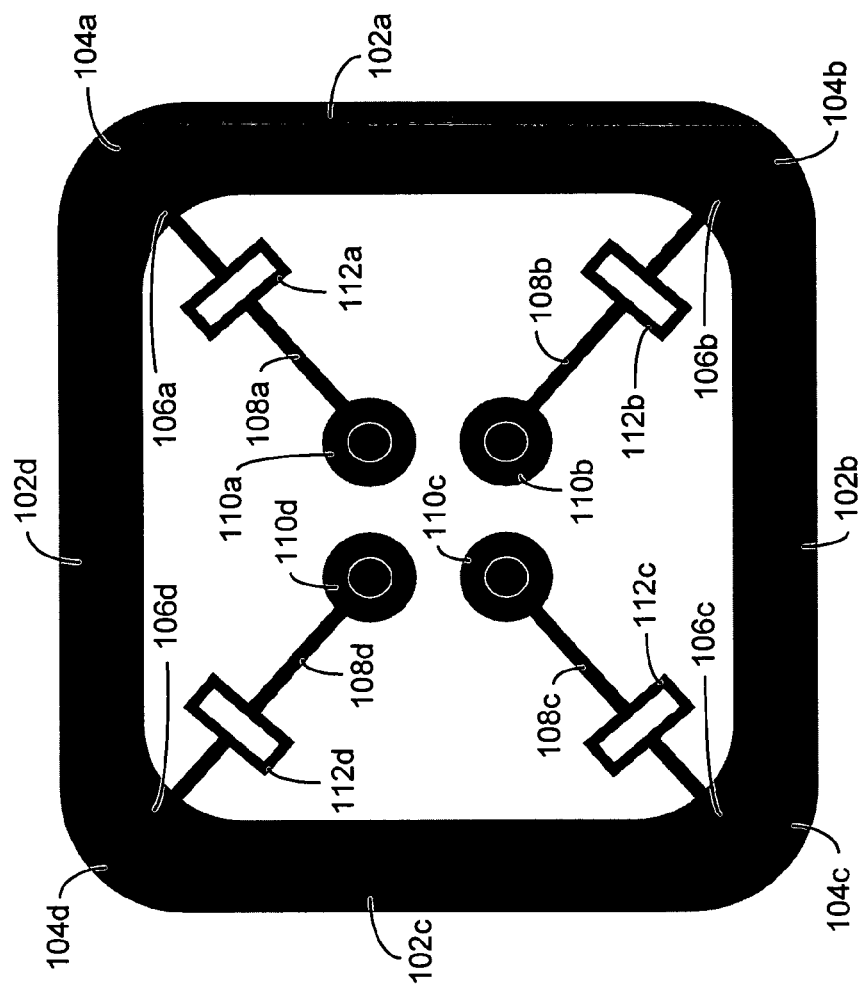
Figure 11A:
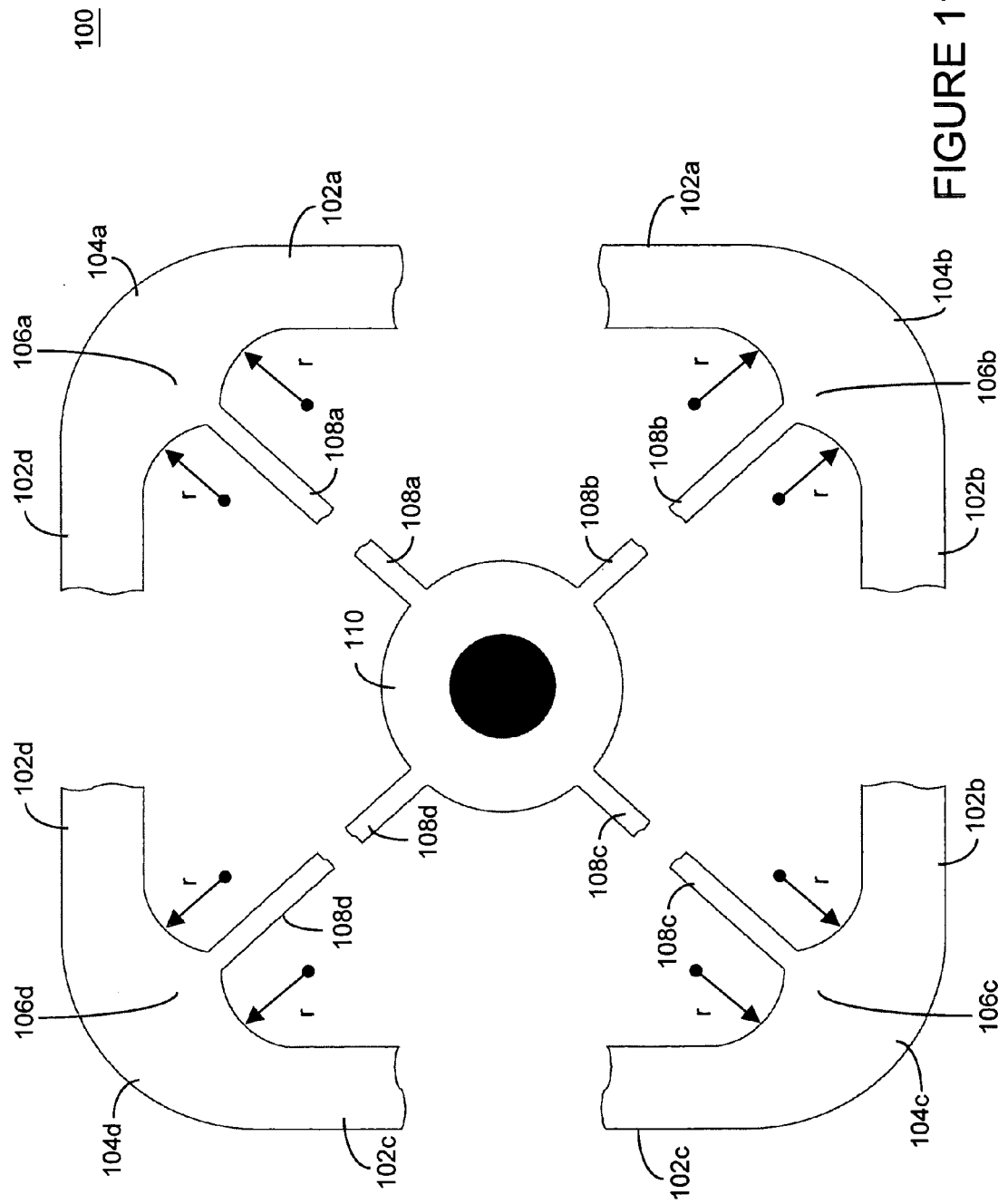
FIGS. 11A, 11B, 12A and 12B are top views of embodiments of a rounded square shaped microelectromechanical resonator according to certain embodiments of present inventions wherein the rounded square shaped microelectromechanical resonator includes four elongated beams (illustrated in partial view) that are interconnected via rounded or curved sections having different radii, and a plurality of anchor coupling sections that connect the rounded or curved sections to one or more anchors.
Figure 11B:
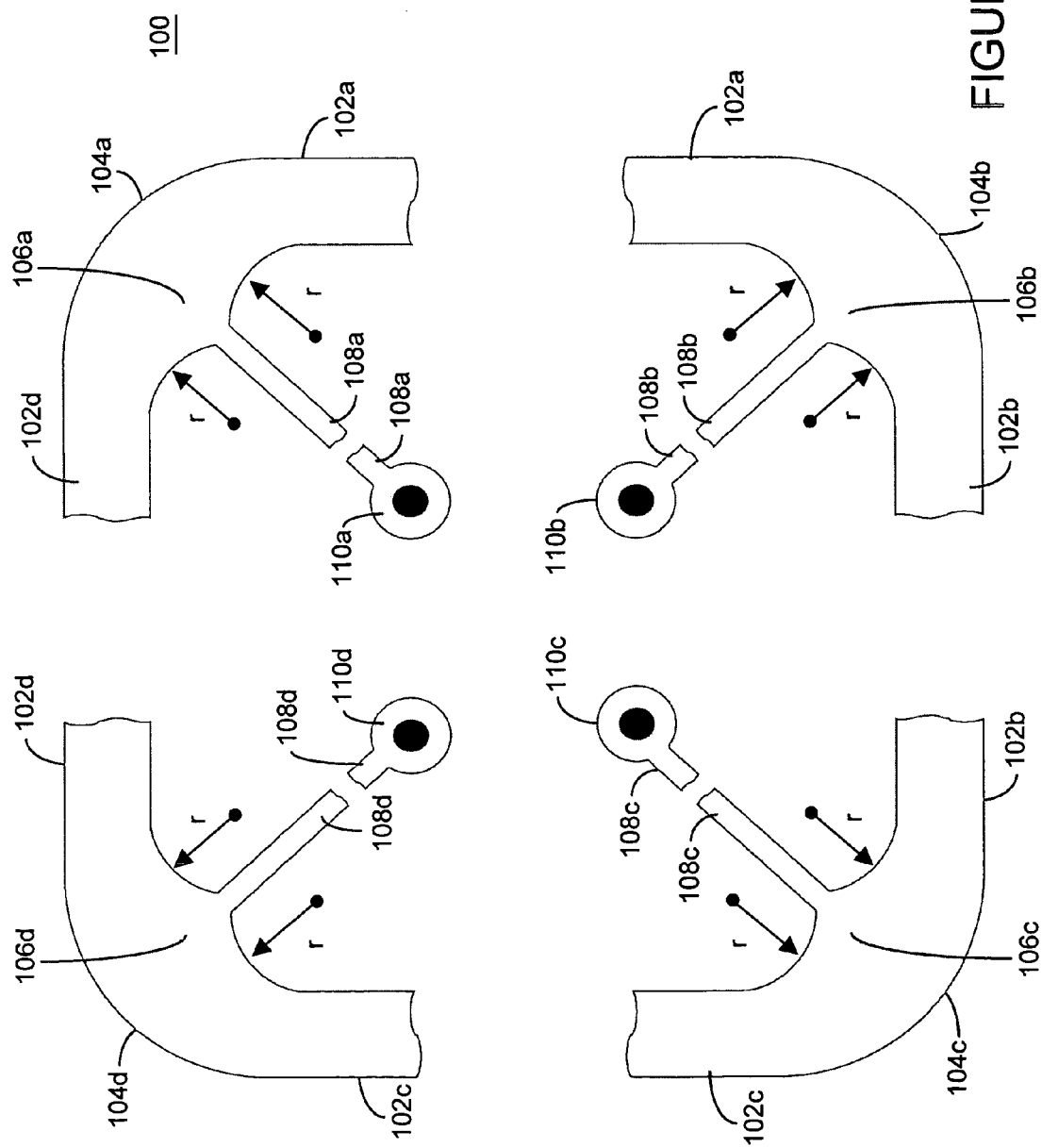
Figure 12A:
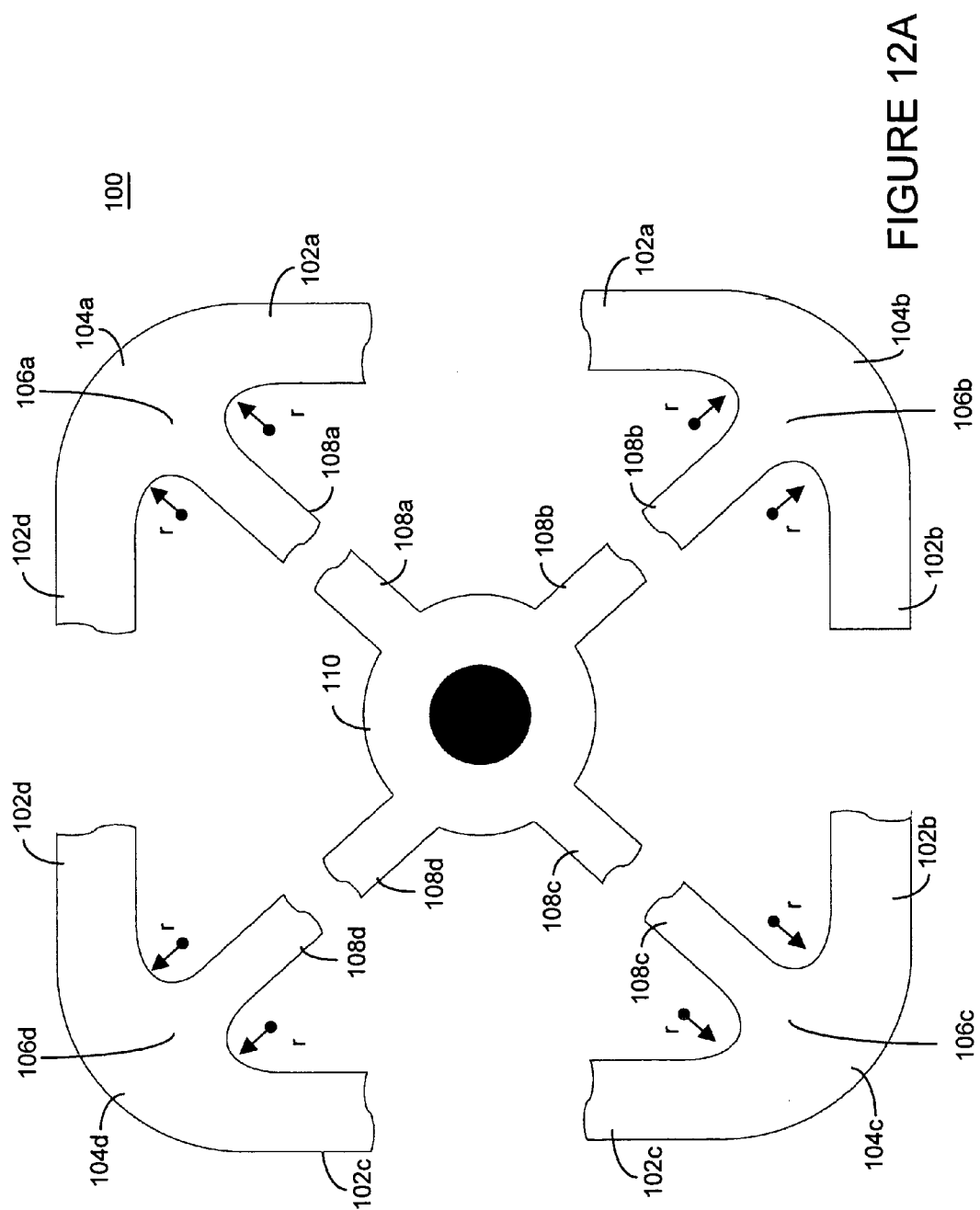
Figure 12B:
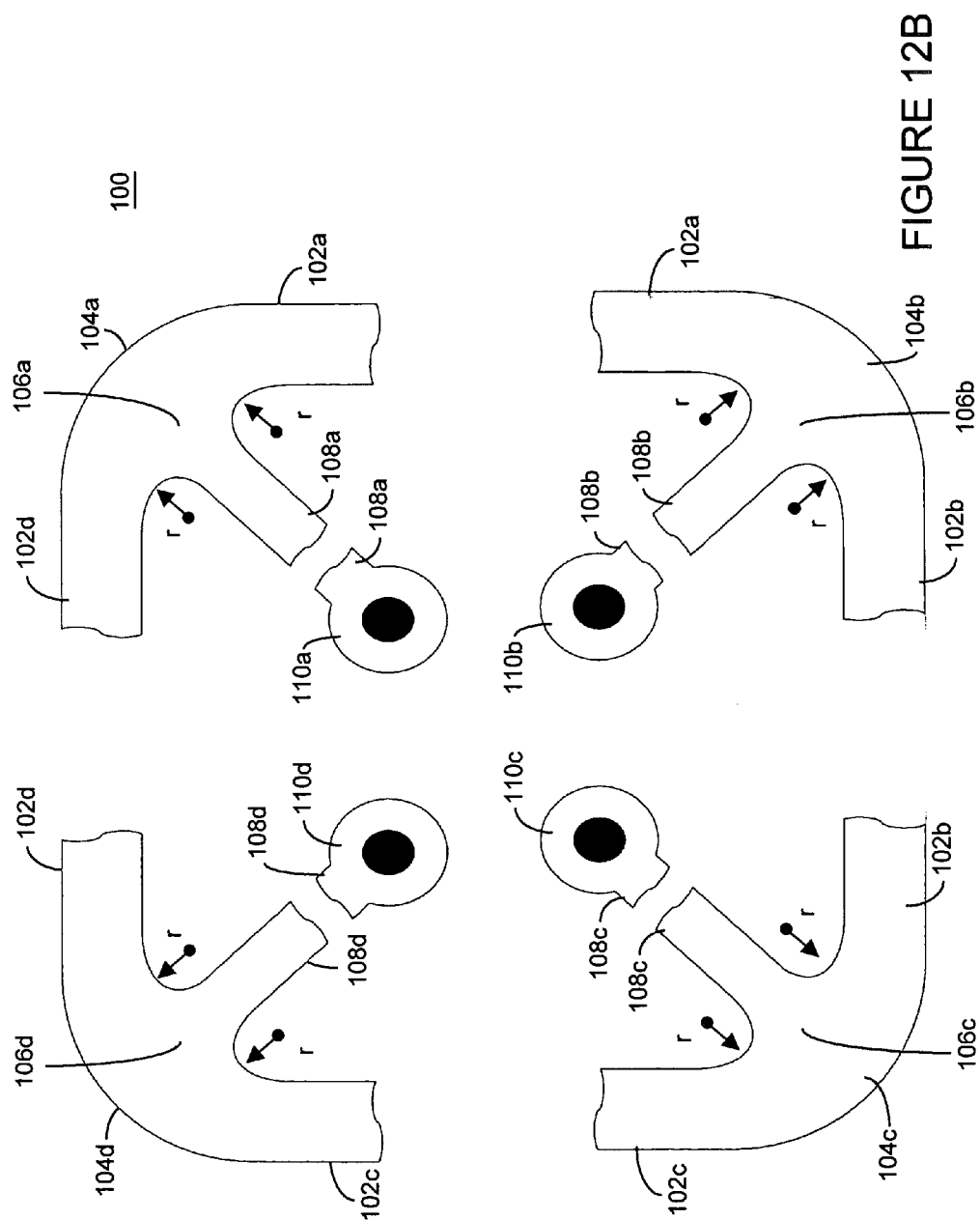
Figure 14:
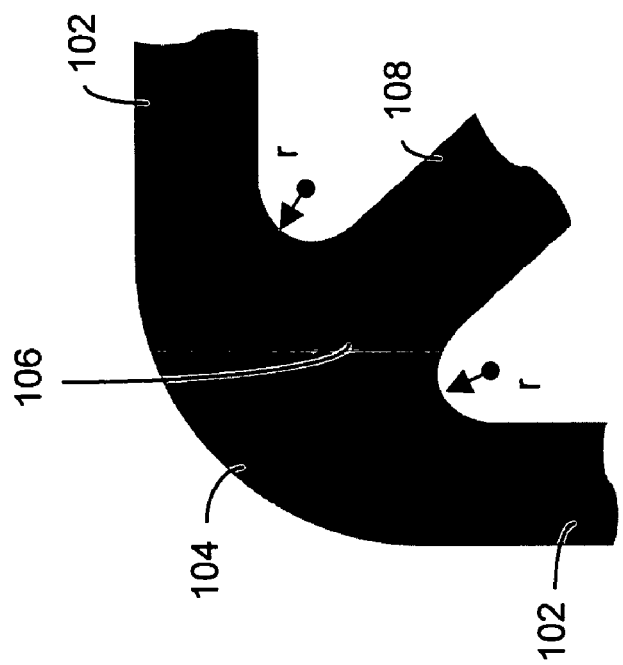
FIGS. 13–17 are top views of various embodiments of anchor coupling sections in conjunction with a section of a microelectromechanical resonator, according to certain embodiments of present inventions.
Figure 13:
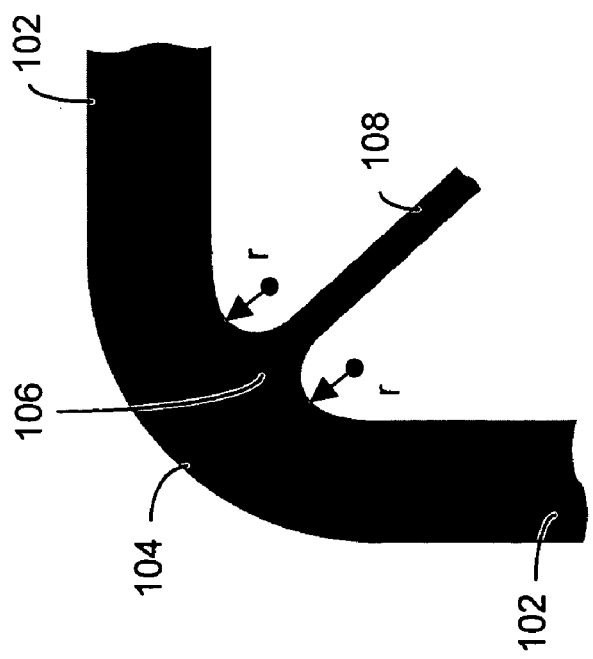
Figure 15:
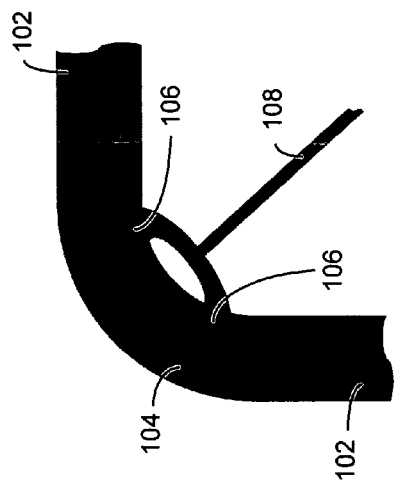
Figure 16:
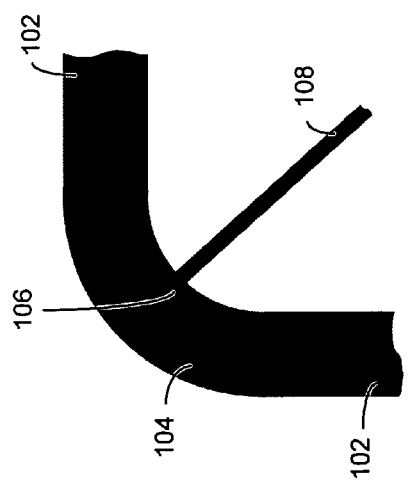
Figure 17:
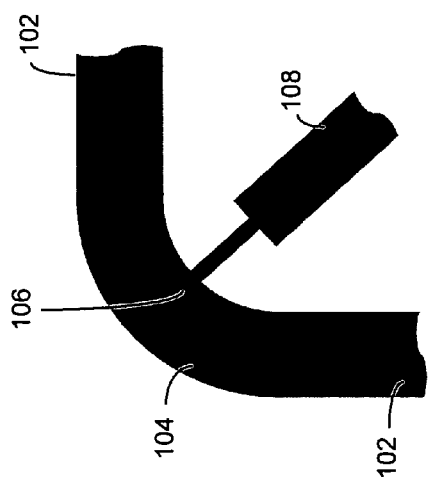
Figure 19:
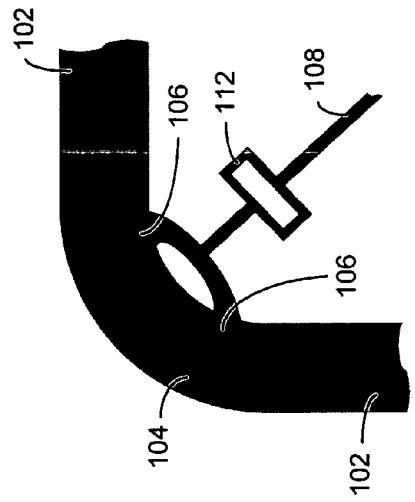
FIGS. 18–20 are top views of various embodiments of anchor coupling sections and stress/strain mechanisms, in conjunction with a section of a microelectromechanical resonator, according to certain embodiments of present inventions.
Figure 18:
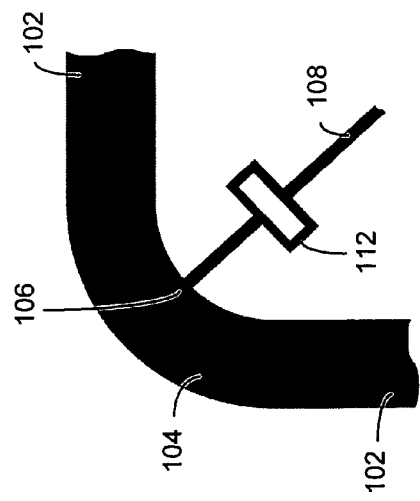
Figure 20:
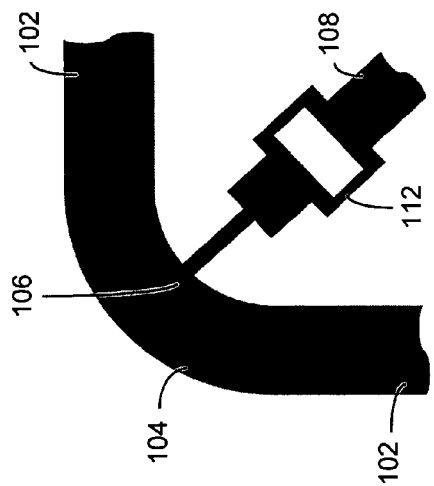

With reference to FIGS. 8–10, the MEMS resonator of the present inventions may employ stress/strain relief mechanisms 112*a–d* (for example, springs or spring-like components) to manage, control, reduce, eliminate and/or minimize any stress or strain on the substrate at the location of the anchor which is caused by the motion of one, some or all of points at which MEMS resonator 100 is anchored through or at the substrate. In particular, curved portions 104*a–d* are mechanically coupled to stress/strain relief mechanisms 112*a–d*, respectively, via anchor coupling section 108*a–d*, respectively.

In operation, stress/strain relief mechanisms 112*a–d* expand and contract in conjunction with the motion of one, some or all of elongated beam sections 102*a–d* and curved sections 104*a–d* in order to reduce, eliminate and/or minimize any stress or strain on the substrate and/or compensate for small remaining movements of the anchoring point due to small asymmetries from manufacturing, material properties may change thereby resulting in a non-100% optimized design (even where Finite Element Modeling (also known as Finite Element Analysis, "FEA" or "F E Analysis") is employed). In this way, the anchoring architecture of MEMS resonator 100 may be relatively stress-free and/or strain-free which may significantly decrease, reduce, minimize and/or eliminate any anchor energy loss and thereby increase, enhance, maximize the Q (and output signal) of resonator 100. Notably, stress/strain relief mechanism 112 and anchor coupling section 108, in addition to decreasing, reducing, minimizing and/or eliminating anchor energy losses, suspend elongated beam sections 102 and curved sections 104 of MEMS resonator 100 above the substrate.

The stress/strain relief mechanisms 112 may be employed within one or more of the one or more anchor coupling section 108. It may be advantageous to implement stress/strain relief mechanisms 112 in those situations where the point at which MEMS resonator 100 is anchored through or at the substrate is not sufficiently or adequately motionless (i.e., where there is undesirable movement of the curved section 102 or coupling section 108 which may originate from or be caused by resonator 100 or the substrate) or where additional de-coupling from the substrate is desired. For example, it may also be advantageous to employ stress/strain relief mechanisms 112 to reduce, eliminate and/or minimize communication of energy between MEMS resonator 100 and the substrate (for example, in those situations where there is an impedance mismatch to a curved section 104 or where "noise" originates in the substrate and is communicated to MEMS resonator 100).

The stress/strain relief mechanisms 112 may be employed in conjunction with any of the anchoring techniques and/or architectures described and/or illustrated herein. For example, stress/strain relief mechanisms 112 may be implemented within one or more of the one or more anchor coupling section 108 of FIG. 5 (for example, within anchor coupling sections 108e–h, or within anchor coupling sections 108a–d, or within anchor coupling sections 108a, 108d, 108f and 108g).

The stress/strain relief mechanisms 112 may be well known springs or spring-like components, or may be any mechanism that reduces, eliminates and/or minimizes: (i) stress and/or strain on the substrate at the location of the anchor which is caused by the motion of one, some or all of points at which MEMS resonator 100 is anchored through or at the substrate, and/or (ii) communication of energy between MEMS resonator 100 and the substrate.

The design (for example, the shape and width) of anchor coupling sections 108 may impact the inner radii of curved sections 104 and thereby (i) the location of nodal points (if any) in or on MEMS resonator 100 as well as (ii) the resonant frequency of MEMS resonator 100. In addition to impacting the inner radii of curved sections 104, the design of anchor coupling section 108 may also affect the durability and/or stability of MEMS resonator 100. In this regard, by adjusting the shape and width of the anchor coupling section 108 in the vicinity of curved section 104 (for example by filleting anchor coupling section 108 in the vicinity of curved section 104 as shown in FIGS. 11A, 11B, 12A, 12B, 13 and 14), the stress on MEMS resonator 100 may be managed, controlled, reduced and/or minimized.

For example, with reference to FIGS. 11A, 11B, 12A and 12B, the width of anchor coupling section 108 may be increased (see, for example, FIGS. 12A and 12B relative to FIGS. 11A and 11B) to manage, control, reduce and/or minimize the stress concentration in or at nodal points 106. In this way, the durability and/or stability of MEMS resonator 100 may be increased, enhanced and/or optimized.

Other designs and/or configurations of anchor coupling sections 108 may be employed to, for example, affect the durability and/or stability of MEMS resonator 100 as well as impact the inner radii of curved sections 104 and the location of nodal points (if any) and the resonant frequency of MEMS resonator 100. (See, for example, FIGS. 13–20). Indeed, all designs of anchor coupling sections 108 whether now known or later developed are intended to fall within the scope of the present invention.

Notably, the shape and/or width of elongated beam section 102 in the vicinity of curved section 104 also impacts the durability and/or stability of MEMS resonator 100 (and in particular, the stress in curved sections 104 which are employed as anchoring locations) as well as impact the inner radii of curved sections 104 and the location of nodal points (if any) and the resonant frequency of MEMS resonator 100. In this regard, by widening elongated beam section 102 in the vicinity of curved section 104 and/or filleting elongated beam section 102 in the vicinity of curved section 104, the stress on the resonator may be reduced and/or minimized.

Thus, in one embodiment, by controlling the shape and width of elongated beam sections 102 and/or anchor coupling section 108, the inner radii of curved sections is defined thereby defining the relationship between the whether and how curved sections 104 move relative to elongated beam sections 102. In addition to determining the inner radii of curved sections 104 and, as such, the locations of nodal points, the shape of elongating beam sections 102 and/or anchor coupling section 108 in the vicinity of curved section 104 may affect the durability and stability of MEMS resonator 100. In this regard, by widening elongated beam section 102 in the vicinity of curved section 104 and/or widening (or filleting) the anchor coupling section 108, the stress on the resonator may be managed, controlled, reduced, minimized and/or optimized.

Notably, as mentioned above, the curvature and/or shape of curved sections 104 may be selected and/or designed to include one or more nodal points or areas in or in the vicinity of curved sections 104. For example, where curved section 104 moves out-of-phase with elongated beam section 102 connected thereto, the radius of a particular curved section 104 may be too small. Conversely, if the radius of a particular curved section 104 is too large, curved section 104 may move in-phase with beam sections 102 that are connected to curved section 104. In each instance, the particular curved section 104 may or may not include a nodal point that minimizes or reduces energy loss and/or substrate stress.

Figure 21B:
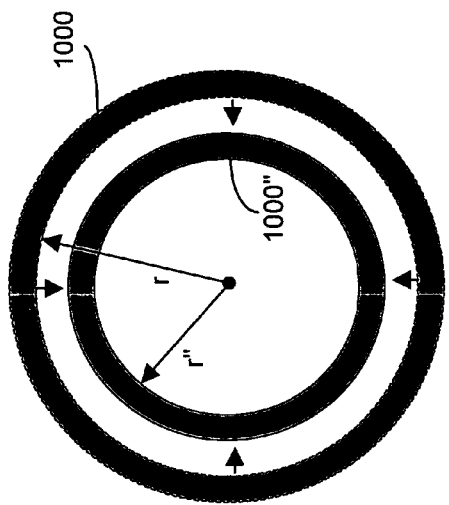
FIGS. 21A and 21B are top views of a ring oscillator that is oscillating in plane in a breathing-like mode or motion, wherein the ring oscillator expands (FIG. 21A) and contracts (FIG. 21B) in relation to a non-induced state.
Figure 21A:
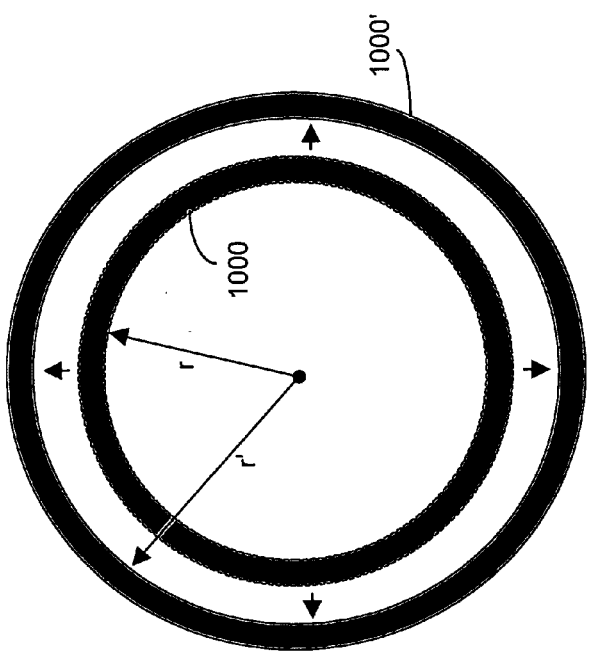
Figure 22A:
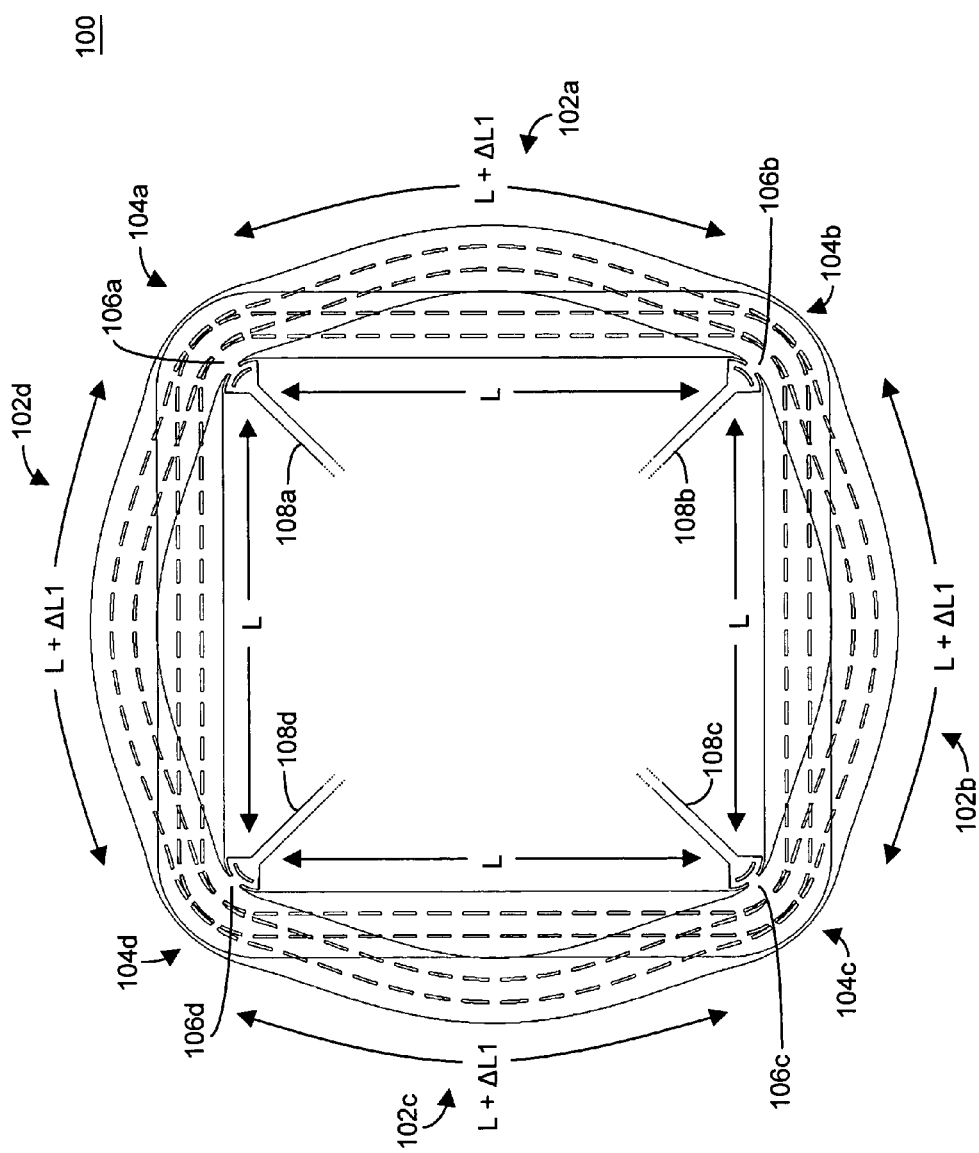
FIGS. 22A and 22B are top views of one embodiment of a rounded square shaped microelectromechanical resonator, including in-plane vibration of elongated beam sections, according to one aspect of present invention, wherein the microelectromechanical resonator oscillates between a first deflected state (FIG. 22A) and a second deflected state (FIG. 22B) and wherein each deflected state is superimposed over (or illustrated relative to) the stationary state of microelectromechanical resonator.
Figure 22B:
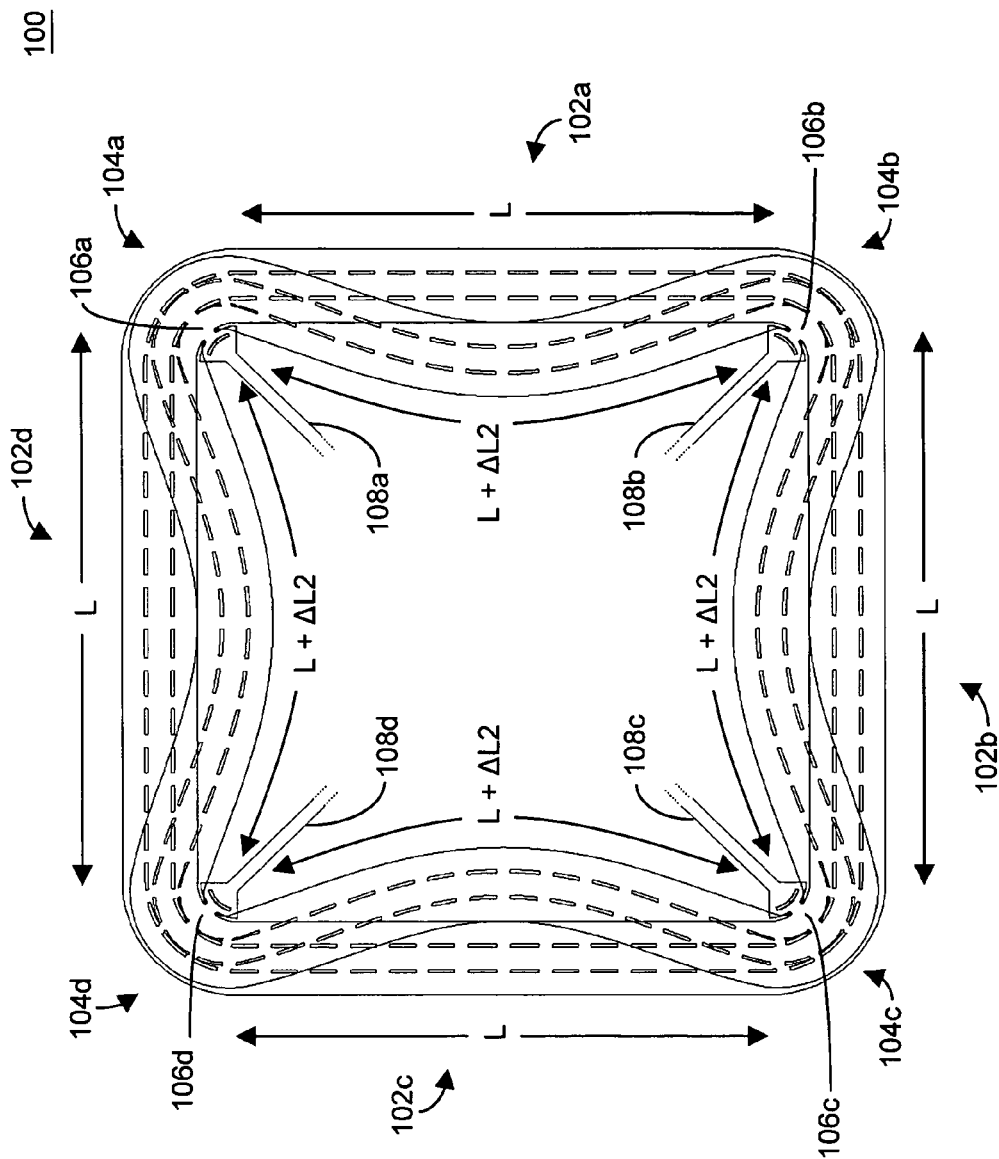

As mentioned above, in operation, beam sections 102 of MEMS resonator 100 oscillate or vibrate at the same frequency. In this regard, beam sections 102 oscillate in an elongating (or breathing) motion or mode (for example, like that of a ring oscillator; see ring oscillator 1000 of FIG. 21A (expanding motion—ring oscillator 1000') and FIG. 21B (contracting motion—ring oscillator 1000")) as well as a bending motion or mode. With reference to FIGS. 22A and 22B, in one embodiment, during operation, beam sections 102a–d of rounded square shaped MEMS resonator 100 oscillate between a first deflected state (FIG. 22A) and a second deflected state (FIG. 22B). Each deflected state in FIGS. 22A and 22B is superimposed over (or illustrated relative to) the stationary state of beam sections 102 and curved sections 104 of MEMS resonator 100.

Notably, when in the first deflected state, in addition to bending, beam sections 102a–d elongate by an amount of $\Delta L1$. Similarly, in the second deflected state, beam sections 102a–d elongate by an amount of $\Delta L2$ and bend in the opposite direction to that of the first deflected state. The amount of elongation (i.e., $\Delta L1$ and $\Delta L2$) may or may not be equal.

Moreover, with continued reference to FIGS. 22A and 22B, nodal points 106a–d in or on curved sections 104a–d experience little to no movement during operation. That is, as MEMS resonator 100 oscillates between the first deflected state and the second deflected state, the areas or portions of curved sections 104a–d which are connect to anchor coupling sections 108 are relatively stationary. The anchors are not illustrated.

Notably, the structure of MEMS resonator 100 oscillates in an inherently linear mode. As such, the considerations and requirements of the drive and sense circuitry, discussed below, to provide a linear resonator/oscillator may be less stringent and/or complex because there may be no need to very precisely or very accurately control the resonant amplitude of beam sections 102. In this regard, some resonator structures (for example, resonators having double-clamped beams, such as double-clamped tuning forks) have modes that are non-linear wherein the output frequency is a function of the resonant amplitude. This effect is evident when a beam transitions from a bending mode transitions to a tensile (elongating) mode. A double-clamped beam, in a primary mode, may exhibit this behavior because at smaller amplitudes the "restring" forces are dominated by bending stress and, at larger amplitudes, the resorting force is dominated by tensile stress. Under this situation, to maintain a constant frequency in such a case the resonant amplitude of the beam may need to be carefully regulated, which may be difficult and likely introduces additional complexity.

Figure 23:
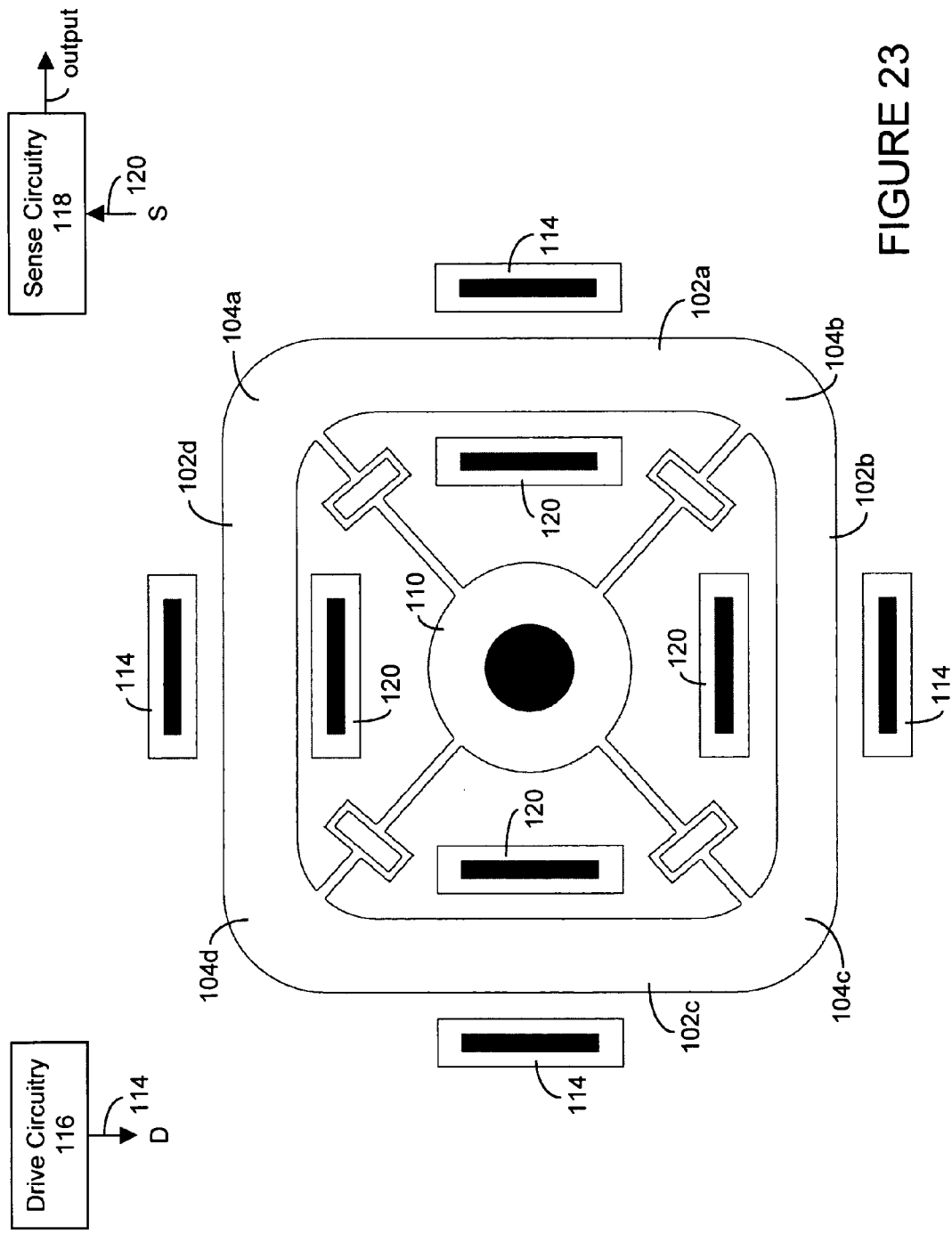
FIG. 23 illustrates a rounded square shaped microelectromechanical resonator having four elongated beam sections that are connected via rounded or curved sections, according to one embodiment of present inventions, in conjunction with drive and sense electrodes and drive and sense circuitry, according to an aspect of present invention.

The sense and drive electrodes and circuitry may be configured to provide a single-ended output signal or differential output signals. With reference to FIG. 23, in one exemplary embodiment of a single-ended output signal configuration, drive electrodes 114 (which are electrically connected to drive circuitry 116) are juxtaposed to beam sections 102 to induce beam sections 102 to oscillate or vibrate wherein the oscillation or vibration has one or more resonant frequencies. The sense circuitry 118, in conjunction with sense electrodes 120 which are juxtaposed to beam sections 102, sense, sample and/or detect a signal having the one or more resonant frequencies. In this regard, sense electrodes 120 are disposed adjacent to beam sections 102 to provide a signal (for example, resulting from a change in capacitance between beam sections 102 and sense electrodes 102 due to the oscillating motion of the resonator structure) which is representative of the oscillation or vibration to sense circuitry 118. The sense circuitry 118 receives the signal and, in response thereto, may output a signal, for example, a clock signal having a resonant frequency. Typically the sense signal output is connected to the drive circuit to close the electronic oscillator loop. In this regard, the phase of the electronic drive signal should be appropriate to stimulate/drive the desired mode.

Notably, while in the exemplary embodiment illustrated FIG. 23 drive electrodes 114 are disposed on the outside of the resonator structure and sense electrodes 120 are disposed within resonator structure, in another embodiment, drive electrodes 114 are disposed on within the resonator structure (i.e., disposed adjacent to the inside surface of beam sections 102) and sense electrodes 120 are disposed on the outside of the resonator structure (i.e., disposed adjacent to the outside surface of beam sections 102).

Moreover, drive circuitry 116 and sense circuitry 118, as well as drive electrodes 114 and sense electrodes 120, may be conventional well-known drive and sense circuitry. Indeed, drive circuitry 116 and sense circuitry 118 may be any MEMS sense and drive circuitry whether now known or later developed.

In addition, drive electrodes 114 and sense electrodes 120 may be disposed or positioned relative to beam sections 102 in order to detect one or more selected or predetermined harmonics of beam sections 102. Moreover, the number and length of drive electrodes 114 and sense electrodes 120 may be selected in order to optimize, enhance and/or improve the operation of the MEMS resonator. Indeed, drive electrodes 114 and sense electrodes 120 may be of any type and/or shape whether now known or later developed.

Notably, drive circuitry 116 and/or sense circuitry 118 may be integrated on the same substrate in which the MEMS resonator structure resides (or is fabricated in). In addition, or in lieu thereof, drive circuitry 116 and/or sense circuitry 118 may be integrated on a substrate that is physically separate from (and electrically interconnected with) the substrate in which the MEMS resonator structure resides.

In another embodiment, MEMS resonator 100 is configured to provide a differential output signal. In this embodiment, the sense and drive electrodes and circuitry are configured to provide output signals that are (or are substantially) 180 degrees out of phase. In this way, MEMS resonator 100 provides a differential output signal pair which includes a relatively large signal to noise relationship due to the summing effects of oscillating beam sections 102 (for example, symmetrical oscillating beam sections).

Figure 24A:
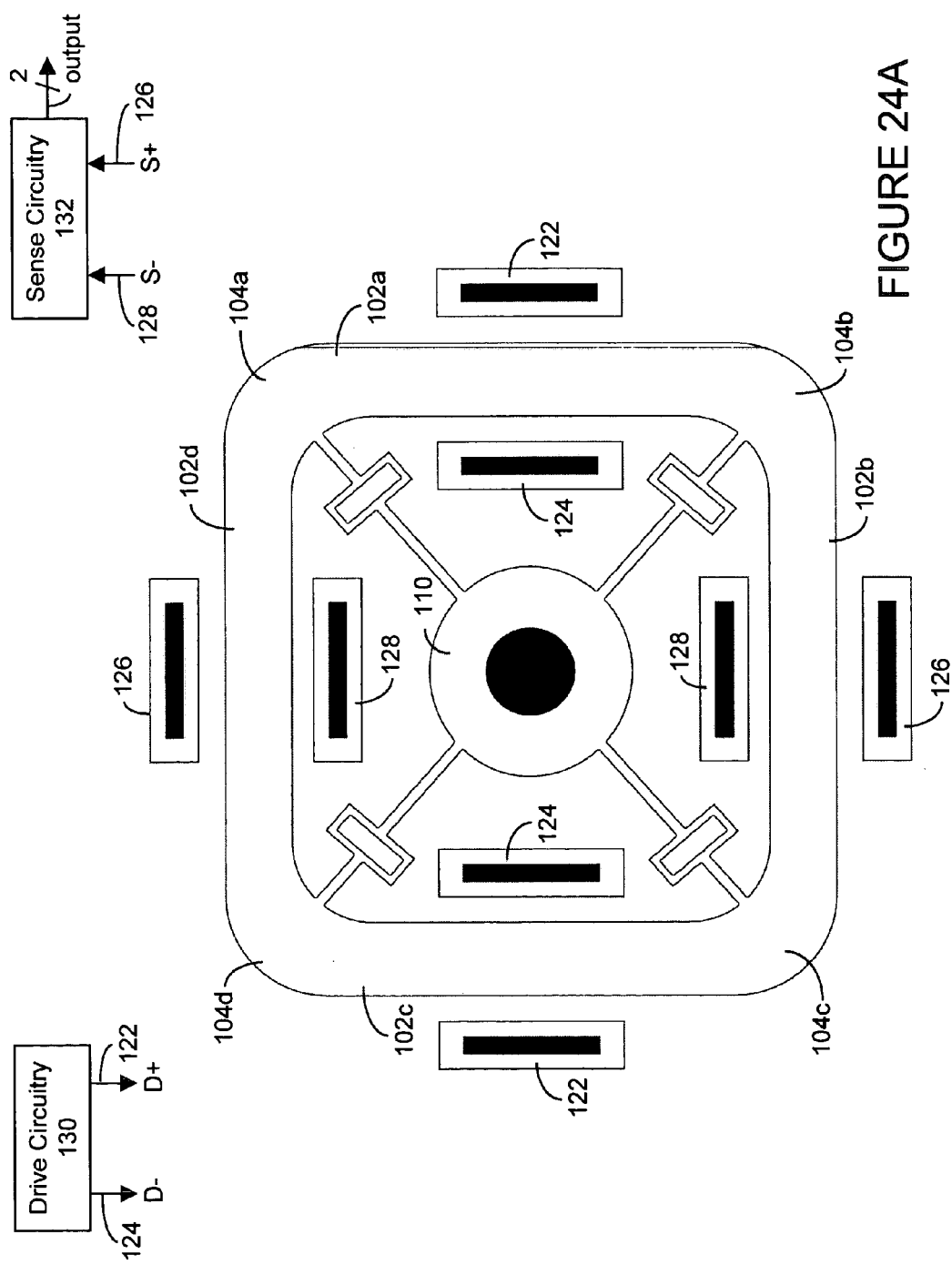
FIG. 24A illustrates a rounded square shaped microelectromechanical resonator, including four elongated beam sections that are connected via rounded or curved sections, in conjunction with a differential output signaling technique and embodiment, having drive and sense electrodes and differential drive and sense circuitry, according to one embodiment of the present invention.

With reference to FIG. 24A, in one exemplary embodiment of a differential output signal configuration, drive electrodes 122 and 124 (which are electrically connected to differential drive circuitry 130) are juxtaposed to beam sections 102a and 102c to induce beam sections 102a and 102c to oscillate or vibrate. In this regard, MEMS resonator 100 vibrates or resonates, in-plane, to generate output signals that are (or are substantially) 180 degrees out of phase. The sense electrodes 126 and 128 are disposed adjacent to beam sections 102b and 102d to provide a signal (for example, resulting from a change in capacitance between beam sections 102 and sense electrodes 102 due to the oscillating motion of the resonator structure) which is representative of the oscillation or vibration to differential sense circuitry 132 which senses, samples and/or detects a signal having the one or more resonant frequencies. The differential sense circuitry 132 receives the signal and, in response thereto, may output a differential signal pair, for example, a differential clock signal having a resonant frequency.

The differential drive circuitry 130 and differential sense circuitry 132 may be conventional well-known circuitry. Indeed, differential drive circuitry 130 and differential sense circuitry 132 may be any type of circuitry (whether or not integrated (or fabricated) on the same substrate in which the MEMS resonator structure resides), and all such circuitry, whether now known or later developed, are intended to fall within the scope of the present invention.

In addition, drive electrodes 122 and 124, and sense electrodes 126 and 128, may be of a conventional, well known type or may be any type and/or shaped electrode whether now known or later developed. Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present invention.

In addition, drive electrodes 114 and sense electrodes 120 may be disposed or positioned relative to beam sections 102 in order to detect one or more selected or predetermined harmonics of beam sections 102. Moreover, the number and length of drive electrodes 114 and sense electrodes 120 may be selected in order to optimize, enhance and/or improve the operation of the MEMS resonator.

Notably, differential drive circuitry 130 and differential sense circuitry 132 may be integrated on the same substrate in which the MEMS resonator structure resides (or is fabricated in). In addition, or in lieu thereof, differential drive circuitry 130 and differential sense circuitry 132 may be integrated on a substrate that is physically separate from (and electrically interconnected with) the substrate in which the MEMS resonator structure resides.

In the embodiment of FIG. 24A, drive electrodes 122 and 124, and sense electrodes 126 and 128, are symmetrically configured, which in conjunction with the symmetrical structures of MEMS resonator 100, manage the stress on beam sections 102 and curved sections 104, anchor coupling sections 108, anchors 110 and/or the substrate. In this way, anchor coupling junction 108 may be a low stress point which may manage, minimize and/or reduce energy loss of MEMS resonator 100.

Figure 24B:
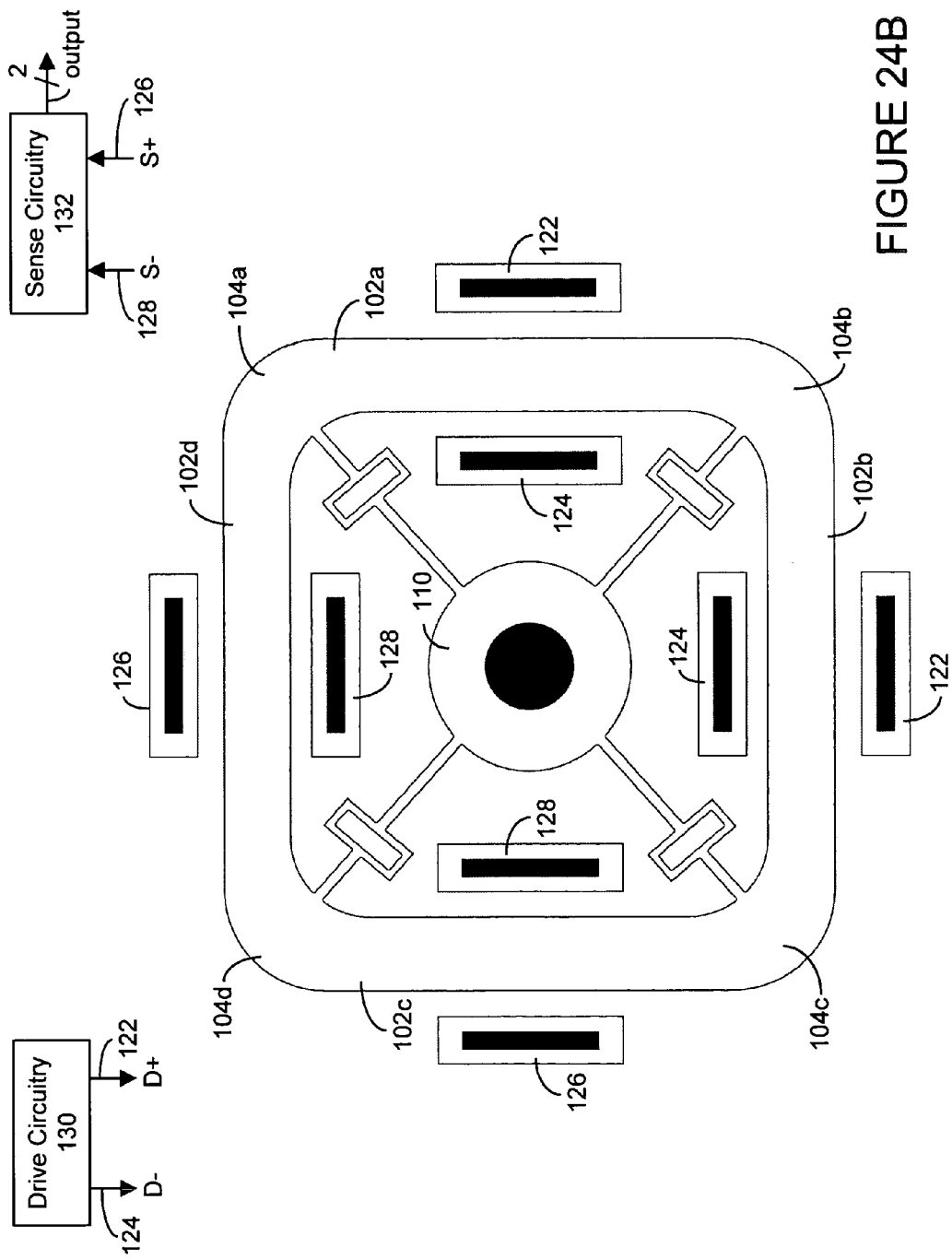
FIG. 24B illustrates a rounded square shaped microelectromechanical resonator, including four elongated beam sections that are connected via rounded or curved sections, in conjunction with a differential output signaling technique and embodiment, having drive and sense electrodes and differential drive and sense circuitry, according to another embodiment of the present invention.

With reference to FIG. 24B, in another exemplary embodiment of a differential output signal configuration, drive electrodes 122 and 124 (which are electrically connected to drive circuitry 130) are juxtaposed to beam sections 102a and 102b to induce beam sections 102 to oscillate or vibrate. The sense electrodes 126 and 128 are disposed adjacent to beam sections 102c and 102d to provide a signal which is representative of the oscillation or vibration to differential sense circuitry 132. The differential sense circuitry 132 receives the signal (having the one or more resonant frequencies) and, in response thereto, may output a differential signal pair, for example, a differential clock signal having a resonant frequency.

In this embodiment, MEMS resonator 100 vibrates or resonates, in-plane, and thereby generates output signals that are (or are substantially) 180 degrees out of phase. The structure of the MEMS resonator 100 may be induced to provide symmetrical motion and, as such, MEMS resonator 100 may have zero net momentum (ideally) and little to no motion (and, as such energy loss) that is introduced into the substrate.

It should be noted, however, that there are many other configurations and or architectures of the sense and drive electrodes that cause or induce beam sections 102 to resonate and thereby generate and/or produce output signals that are (or are substantially) 180 degrees out of phase. All such configurations and/or architectures are intended to fall within the scope of the present invention.

Moreover, implementing a differential signal configuration may facilitate canceling, limiting, reducing and/or minimizing the effect of capacitive coupling from the drive electrodes to the sense electrodes. In addition, a fully differential signaling configuration may also significantly decrease any sensitivity to electrical and/or mechanical noise coupled from the substrate. Further, implementing MEMS resonator 100 in a differential signaling configuration may also eliminate, minimize and/or reduce charge flow through the anchor to and from the structure. As such, a voltage drop between the substrate anchor and drive and sense electrodes may be avoided. Notably, this voltage drop could degrade or adversely impact the electric transfer function of the MEMS resonator especially at higher frequencies (for example, frequencies greater than 100 MHz).

It may be advantageous to implement temperature management techniques in order to manage and/or control the Q factor of MEMS resonator 100. In this regard, when beam sections 102 and/or curved sections 104 bend, one side of the section is stretched thereby causing a slight cooling in the area of the stretching, and the other side is compressed, thereby causing a slight heating in the area of the compression. The heat gradient causes diffusion from the "hotter" side to the "cooler" side. The diffusion of heat ("heat flow") results in a loss of energy, which may impact (for example, reduce) the Q factor of MEMS resonator 100. This effect is often referred to as Thermo Elastic Dissipation ("TED"), which may be a dominate limit of the Q factor of a resonant structure. As such, is may be advantageous to implement temperature management techniques in order to manage, control, limit, minimize and/or reduce TED.

Figure 25:
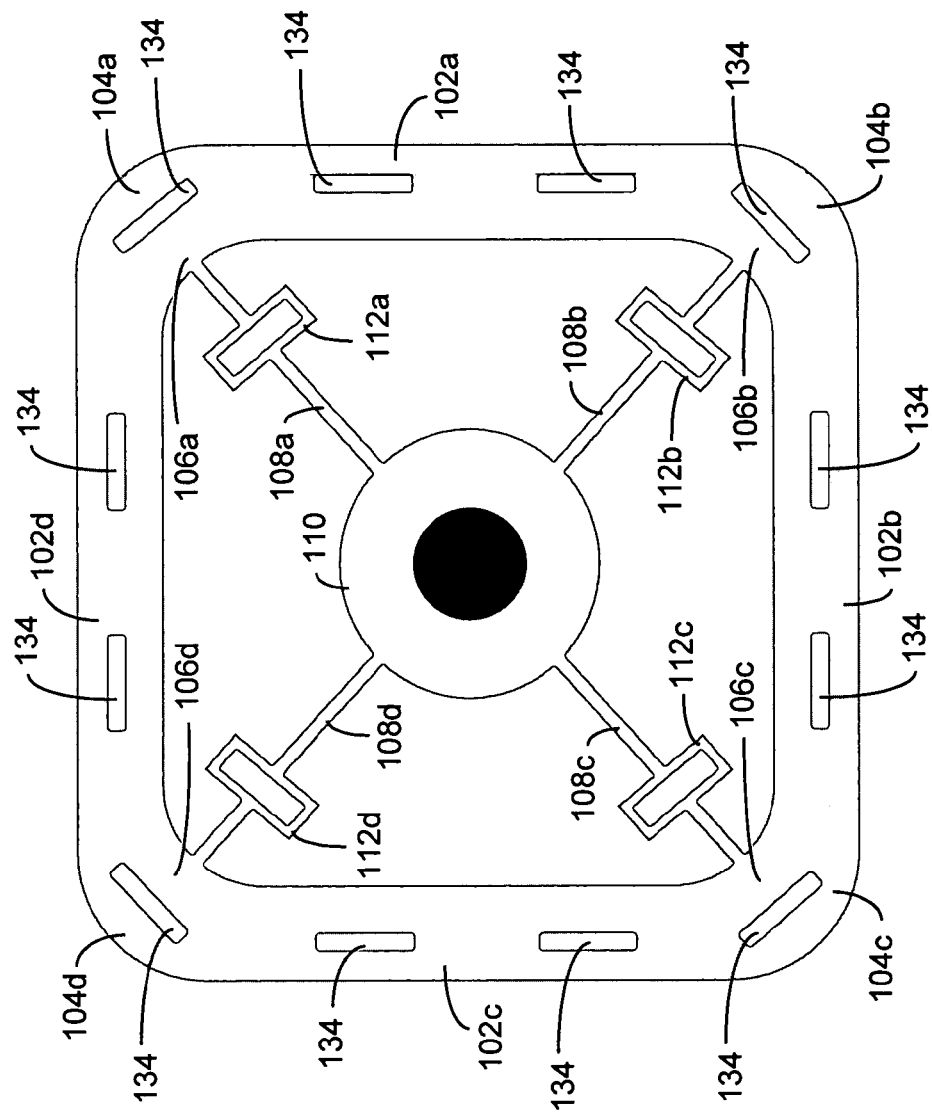
Figure 27:
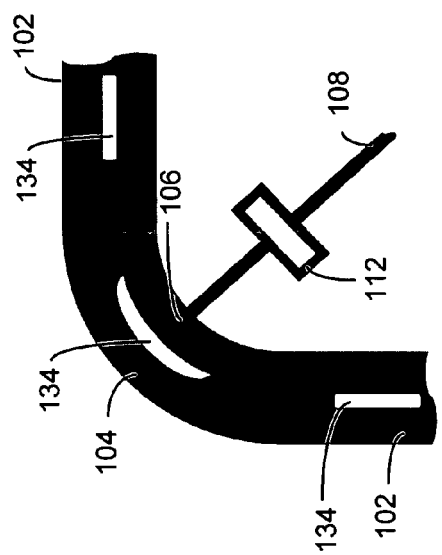
Figure 26:
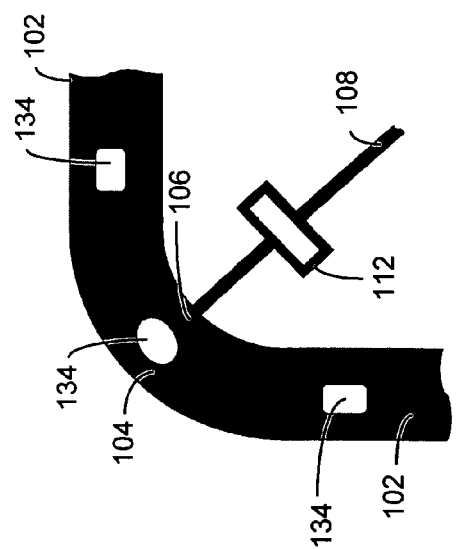
Figure 29:
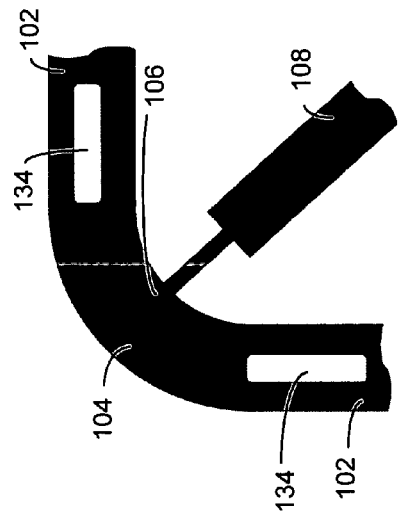
Figure 28:
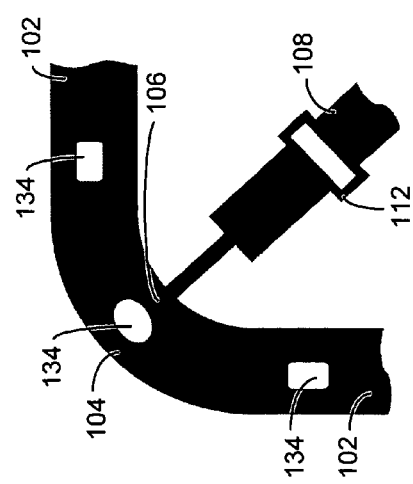
Figure 30:
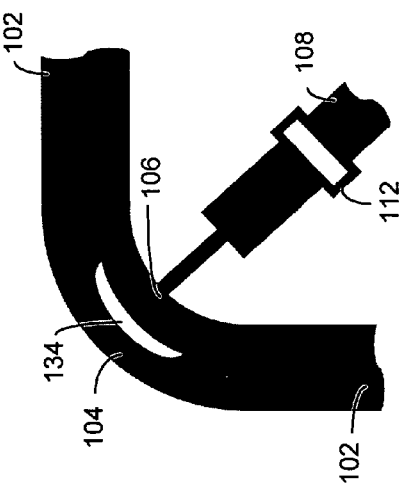
Figure 32:
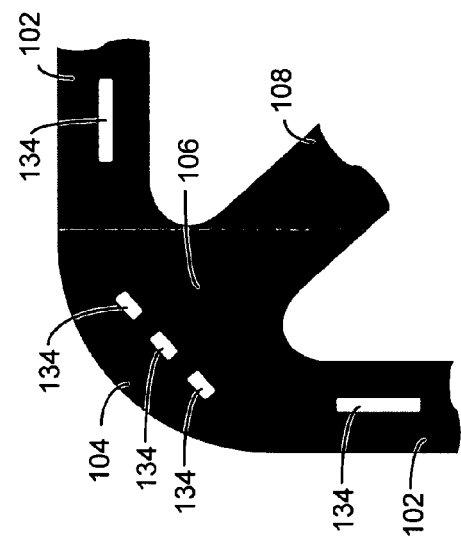
Figure 31:
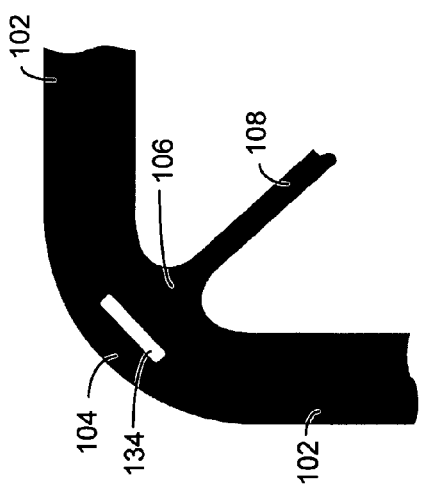

In one temperature management embodiment, with reference to FIG. 25, slots 134 are formed in one or more of beam sections 102a–d and curved sections 104a–d of MEMS resonator 100. The slots 134 suppress/reduce heat flow between the sides of beam sections 102a–d and the sides of curved sections 104a–d as beam sections 102a–d and curved sections 104a–d stretch and compress during operation. The suppression/reduction of heat transfer within the beam sections 102a–d and curved sections 104a–d may lead to a higher Q factor for MEMS resonator 100. It has to be noted that the methods of temperature management by using slots affects the optimization of the zero movement at the anchoring point and has to be considered by the design (for example, FEA).

Figure 33:
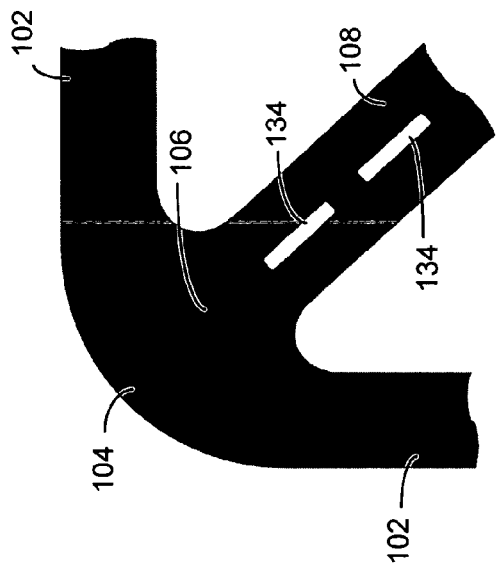
Figure 34:
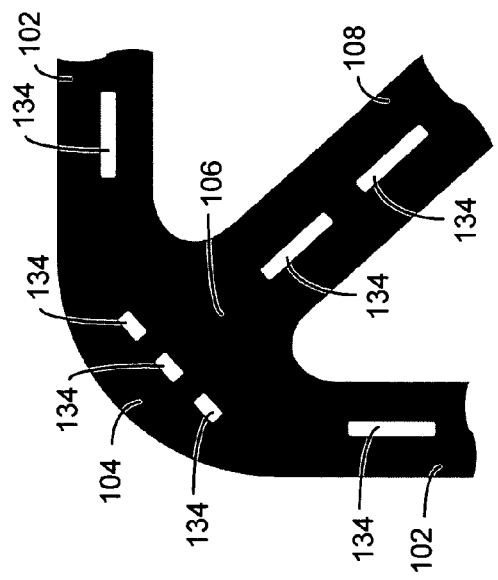
Figure 38A:
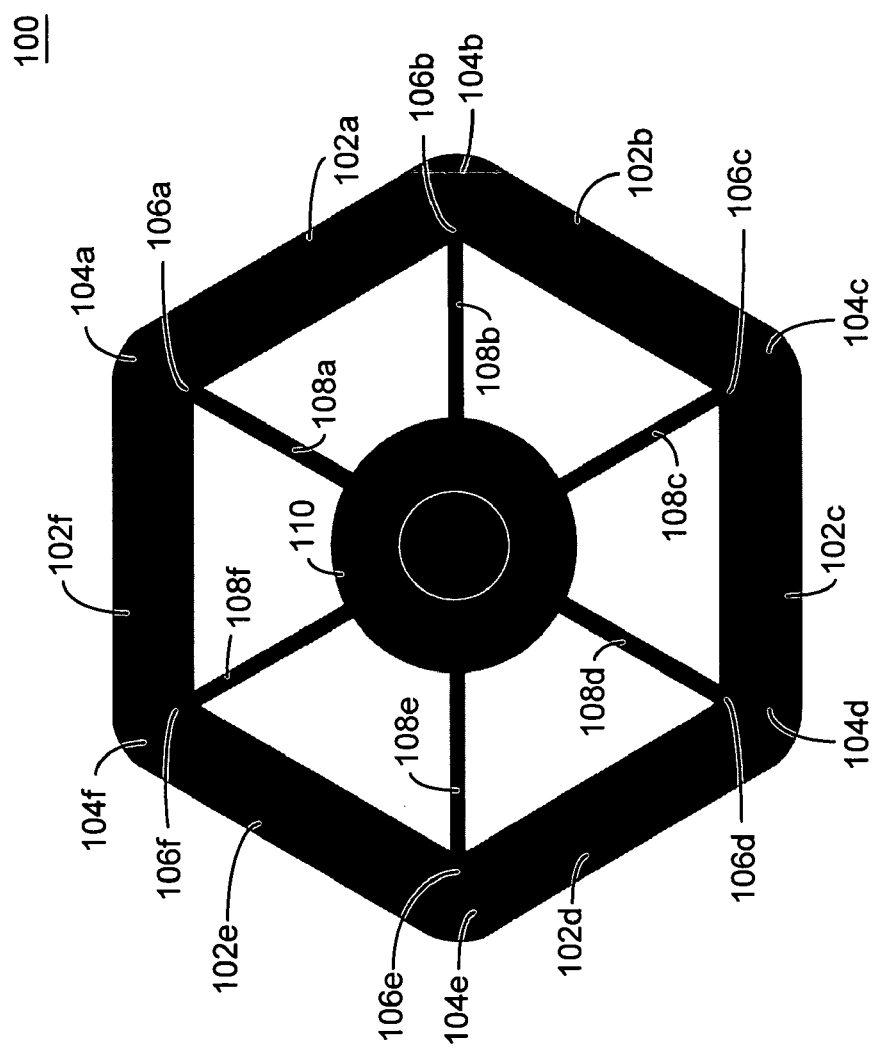
FIGS. 38A–38D are top views of embodiments of a rounded hexagon shaped microelectromechanical resonator having six elongated beam sections that are interconnected via curved sections, in conjunction with various anchoring techniques, architectures and/or configurations for securing the resonator to the substrate, according to embodiments of aspects of present invention.
Figure 38B:
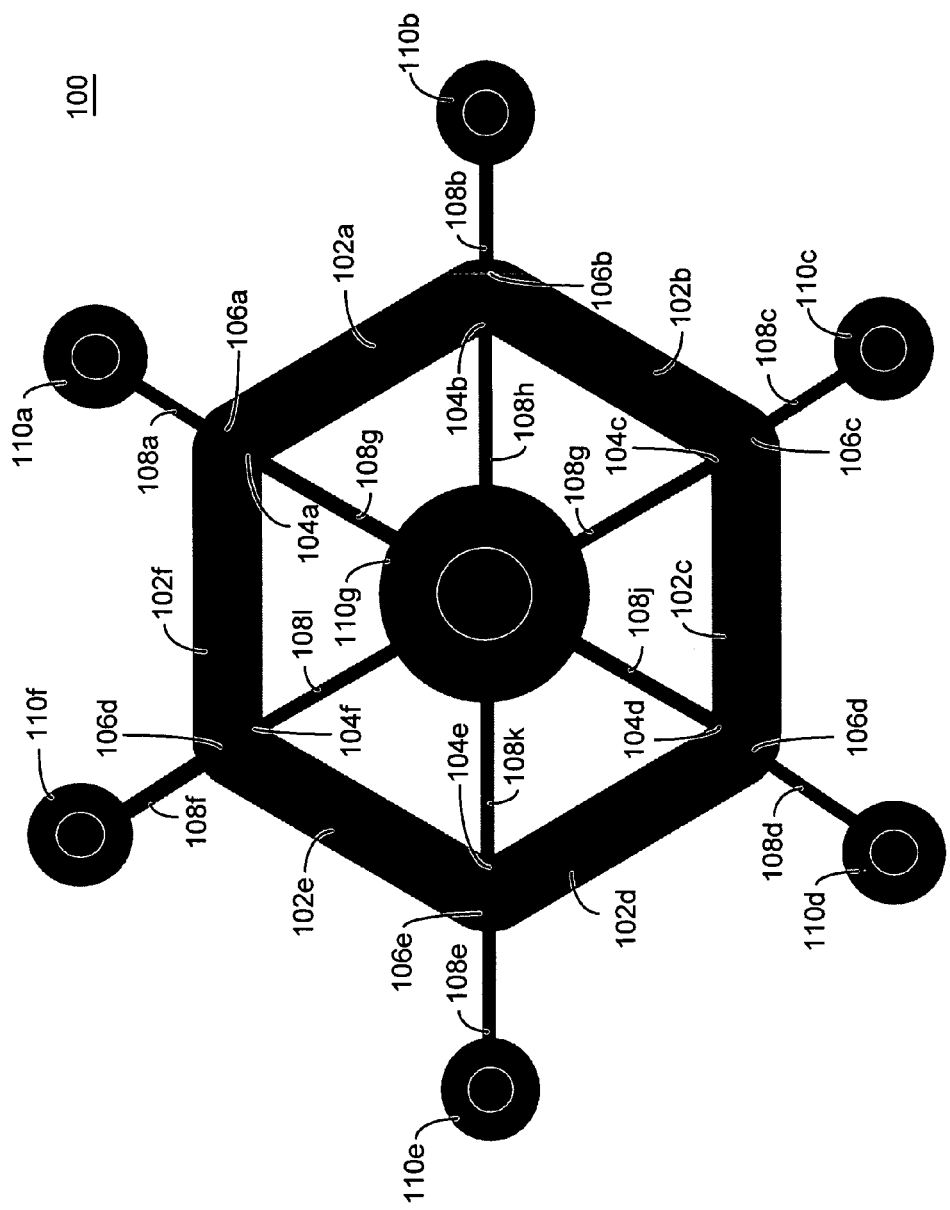
Figure 38C:
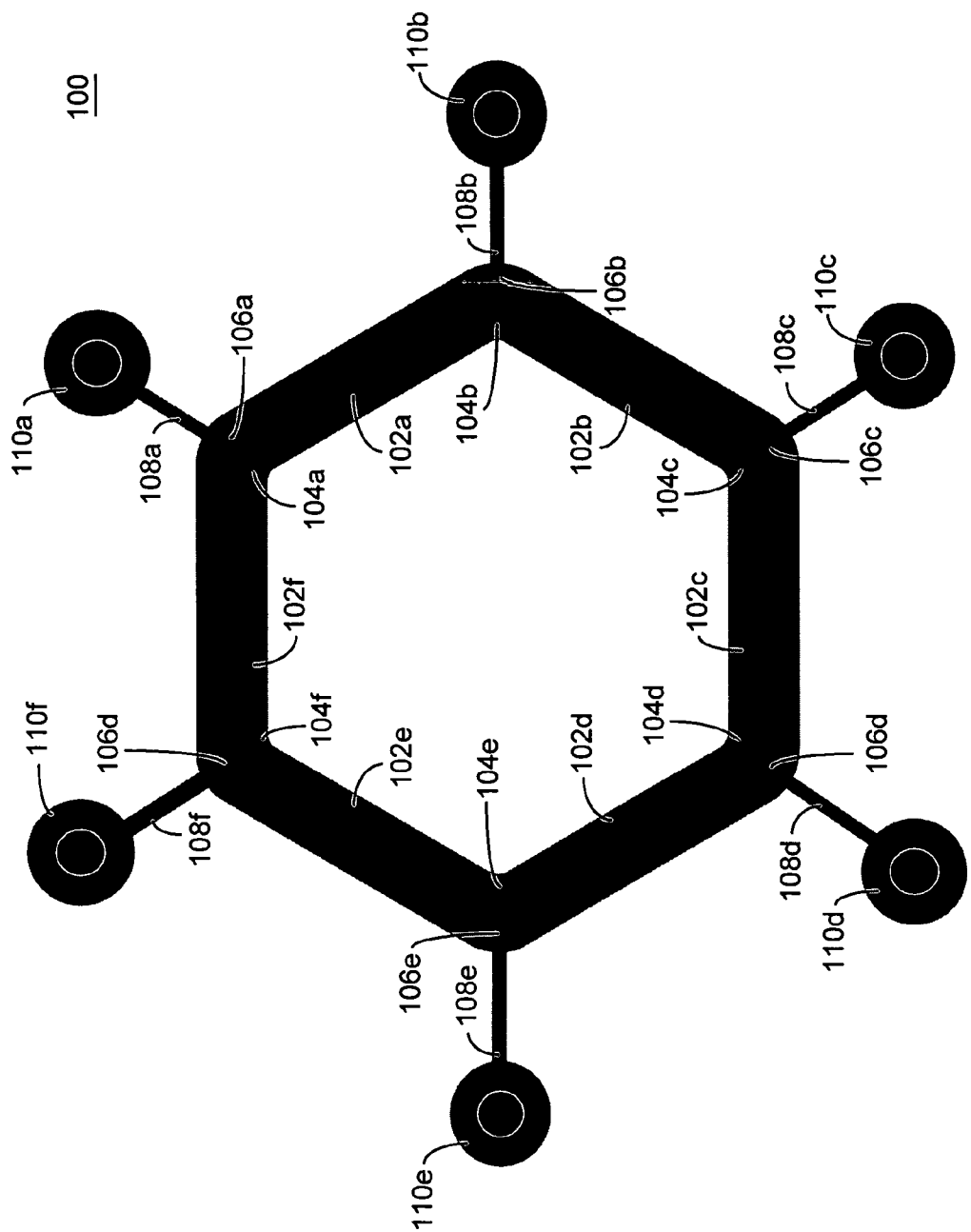
Figure 38D:
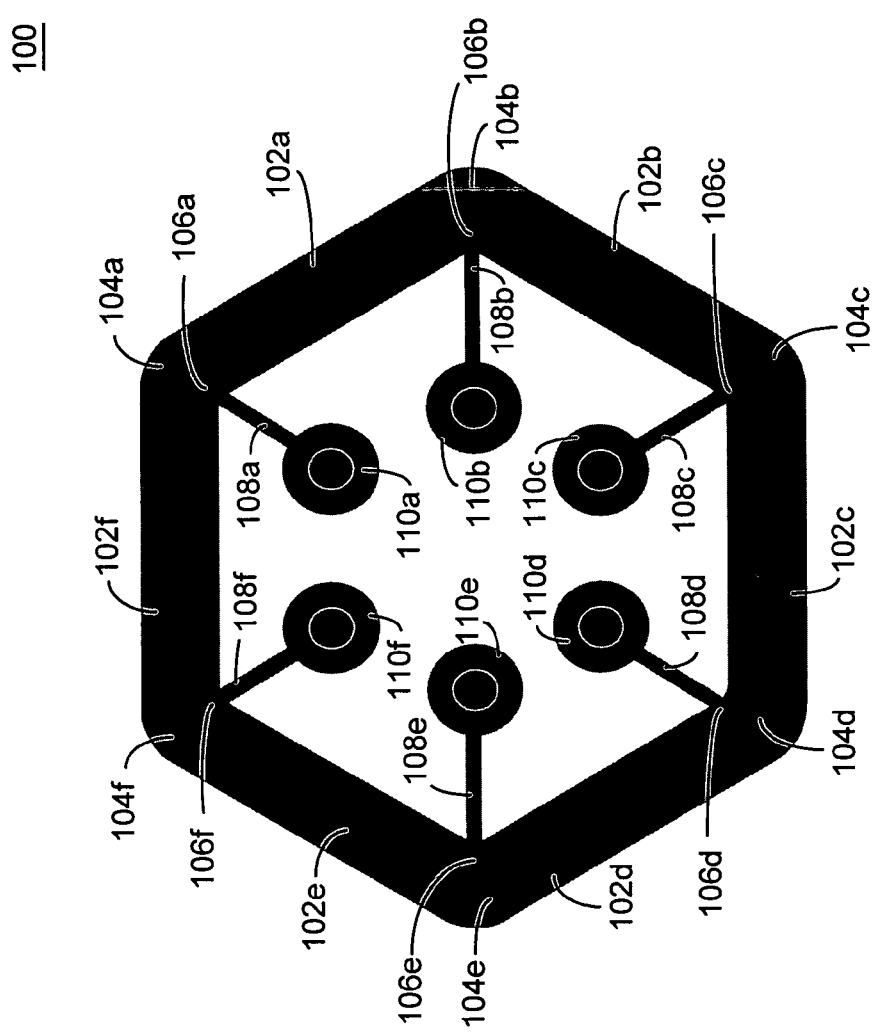
Figure 38E:
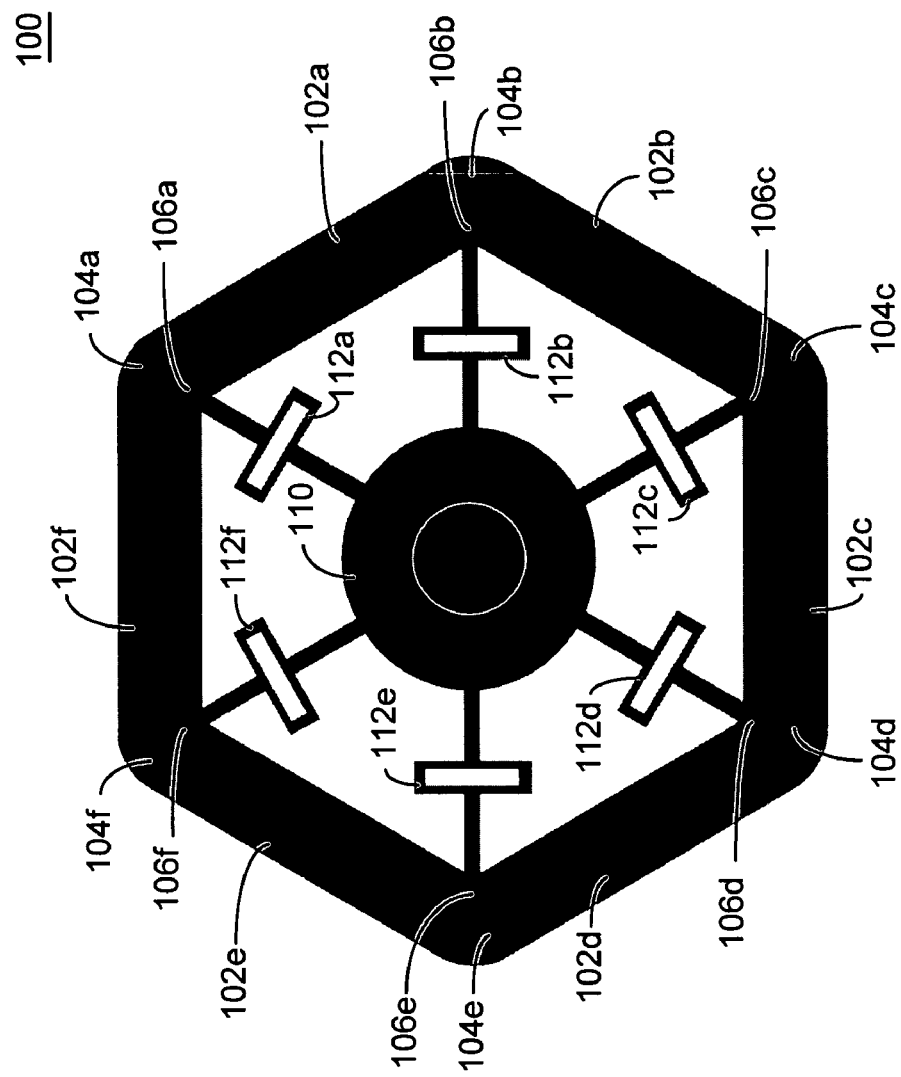
FIG. 38E is a top view of an embodiment of a rounded hexagon shaped microelectromechanical resonator having six elongated beam sections that are interconnected via curved sections, in conjunction with an anchoring configuration and stress/strain management technique, according to an embodiment of an aspect of present invention.

Notably, the temperature management techniques may be employed in one or more beam sections 102 or one or more curved sections 104 of MEMS resonator 100 (see, for example, FIGS. 29–31 and 35–37), or both (see, for example, FIGS. 26–28 and 31). In addition thereto, or in lieu thereof, the temperature management techniques may also be implemented in anchor coupling sections 108. (See, for example, FIGS. 33 and 34). The slots 134 may be any shape including, for example, square, rectangle, circular, elliptical and/or oval. Indeed, slots 134 of any shape, whether geometric or otherwise, may be incorporated into beam sections 102, curved sections 104 and/or anchoring coupling sections 108.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Notably, although a significant portion of the description of the present inventions was set forth in the context of a rounded square shaped MEMS resonator (see, FIGS. 3–6), a MEMS resonator according to the present invention may be any geometric shaped resonator architecture or structure including a plurality of elongated beam sections that are connected by curved or rounded sections. For example, as mentioned above, in one embodiment, the MEMS resonator of the present inventions may include three elongated beam sections that are connected together via curved sections to form a rounded triangle shape, as illustrated in FIG. 2A. In another embodiment, the MEMS resonator of the present invention may include six beam sections and six curved sections as illustrated in FIG. 2C. All of the features, embodiments and alternatives discussed above with respect to a MEMS resonator having a rounded square shape are applicable to MEMS resonators, according to the present invention, which have other shapes. (See, for example, FIGS. 38A–38E). For the sake of brevity, those discussions will not be repeated.

The MEMS resonator of the present invention may employ any sense and drive techniques whether now known or later developed. The drive and sense circuitry (whether differential or not) may be integrated on the same substrate in which the MEMS resonator structure resides (or is fabricated in). In addition, or in lieu thereof, drive and sense circuitry may be integrated on a substrate that is physically separate from (and electrically interconnected with) the substrate in which the MEMS resonator structure resides. Moreover, the drive and sense electrode may be of a conventional type or may be any type and/or shape whether now known or later developed.

Notably, the dimensions, characteristics and/or parameters of a MEMS resonator according to the present invention may be determined using a variety of techniques including finite element modeling and simulation techniques (for example, a finite element modeling via a computer driven analysis engine such as FemLab (from Consol), ANSYS (from ANSYS INC.), IDEAS and/or ABAKUS and/or empirical data/measurements. For example, a finite element modeling engine, using or based on a set of boundary conditions (for example, the size of the resonator structure), may be employed to determine and assess the dimensions, characteristics and/or parameters of (i) elongated beam sections 102, (ii) curved sections 104, (iii) nodal point(s) 106 (if any), (iv) anchor coupling section 108 and/or (v) stress/strain mechanisms 112. Indeed, the impact and/or response of MEMS resonator 100 on or at the anchor and/or substrates may also be observed and/or determined using such a finite element modeling, simulation and analysis engine.

As mentioned above, a finite element analysis and simulation engine may also be employed to determine the location of any nodal points. Such nodal points may provide a suitable location at which MEMS resonator 100 may be anchored to the substrate with predetermined, minimal and/or reduced energy loss (among other things). In this regard, beam sections 102 of MEMS resonator 100, when induced, move in a breathing-like manner and a bending-like manner. As such, the length of beam sections 102 and the radii of curved sections 104 may determine the location of nodal points of the resonator structure whereby there is little, no or reduced rotation movement due to the elongating-like (breathing-like) mode, as well as little, no or reduced radial movement due to the bending-like mode. A finite element analysis engine may be employed to determine or predict the location of such nodal points based on a given length of beam sections 102 and the radii of curved sections 104 of a MEMS resonator 100. In this way, locations that exhibit acceptable, predetermined, and/or little or no movement (radial and/or otherwise) for anchoring MEMS resonator 100 may be rapidly determined and/or identified.

Further, a thermo-mechanical finite element analysis engine may be employed to enhance any temperature considerations of beam sections 102, curved sections 104 and/or anchoring coupling sections 108 during operation. In this regard, thermo-mechanical finite element analysis engine may model the operation of a MEMS resonator 100 and thereby determine the size, location, dimensions, and number of slots to implement in one or more beam sections 102, curved sections 104 and/or anchoring coupling sections 108. In this way, the characteristics of MEMS resonator 100, having temperature management techniques implemented therein, may be enhanced and/or optimized and the TED loss minimized and/or reduced.

Thus, as mentioned above, many of the properties of the structures of the present inventions may be optimized with Finite Element Modeling (FEM), which is also known as "FEA" or "FE Analysis".

The beam sections 102 may or may not include identical or substantially identical dimensions/designs (i.e., have the same or substantially the same width, thickness, height, length and/or shape). In addition, curved sections 104 may or may not include identical or substantially identical dimensions/designs (i.e., have the same or substantially the same inner radius, width, thickness, height, length, outer radius and/or shape). As such, MEMS resonator 100 may include beam sections 102 and/or curved sections 104 having different dimensions, shapes and/or designs.

The MEMS resonator of the present inventions may be fabricated from well-known materials using well-known techniques. For example, the MEMS resonator may be fabricated from well-known semiconductors such as silicon, germanium, silicon-germanium or gallium-arsenide. Indeed, the MEMS resonator may be comprised of, for example, materials in column IV of the periodic table, for example silicon, germanium, carbon; also combinations of these, for example, silicon germanium, or silicon carbide; also of III–V compounds for example, gallium phosphide, aluminum gallium phosphide, or other III–V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, the MEMS resonator according to the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope of the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure may be formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

In those instances where the MEMS resonator structure according to the present inventions is fabricated in or on polycrystalline silicon or monocrystalline silicon, certain geometric shaped MEMS resonator structures according to the present inventions, for example, the rounded square shaped resonator, may maintain structural and material symmetry with polycrystalline silicon or monocrystalline silicon. In particular, a rounded square shape MEMS resonator according to the present inventions may be inherently more compatible with the cubic structure of monocrystalline silicon. In each lateral orthogonal direction on a standard wafer (e.g. 100, 010, or 110), the properties of the monocrystalline silicon may be matched to one or more geometric shaped resonators. In this regard, the crystalline properties of monocrystalline silicon may have the same or suitable symmetry as the one or more geometric shaped resonator structure.

The MEMS resonator 100 of the present invention may be packaged using a variety of techniques and materials, for example, thin film techniques, substrate bonding techniques (for example, bonding semiconductor or glass-like substrates) and prefabricated package (for example, a TO-8 "can"). Indeed, any packaging and/or fabricating techniques may be employed, whether now known or later developed; as such, all such fabrication and/or packaging techniques are intended to fall within the scope of the present invention. For example, the systems, devices and/or techniques described and illustrated in the following non-provisional patent applications may be implemented:

(1) "Electromechanical System having a Controlled Atmosphere, and Method of Fabricating Same", which was filed on Mar. 20, 2003 and assigned Ser. No. 10/392,528;

(2) "Microelectromechanical Systems, and Method of Encapsulating and Fabricating Same", which was filed on Jun. 4, 2003 and assigned Ser. No. 10/454,867; and (3) "Microelectromechanical Systems Having Trench Isolated Contacts, and Methods of Fabricating Same", which was filed on Jun. 4, 2003 and assigned Ser. No. 10/455,555.

The inventions described and illustrated in the aforementioned patent applications may be employed to fabricate MEMS resonator of the present inventions. For the sake of brevity, those discussions will not be repeated. It is expressly noted, however, that the entire contents of the aforementioned patent applications, including, for example, the features, attributes, alternatives, materials, techniques and/or advantages of all of the inventions/embodiments, are incorporated by reference herein.

Where MEMS resonator 100 implements a rounded square shape resonator structure that is symmetrically anchored (see, for example, FIGS. 4–6 and 8–10), the center of gravity of the structure remains relatively constant or fixed during operation. In this regard, in operation, when first beam section (for example, beam section 102*a*) moves in a first lateral direction and includes some vertical movement, an "opposite" beam (for example, beam section 102*c*) moves in an opposite lateral direction and includes an opposite vertical movement. In this way, the movements generally cancel and, as such, the center of gravity of the resonator structure remains relatively constant. Notably, the four beam sections of MEMS resonator 100 implementing a rounded square shape resonator structure may statistically average Gaussian process tolerances which may provide better parameter control.

Figure 39:
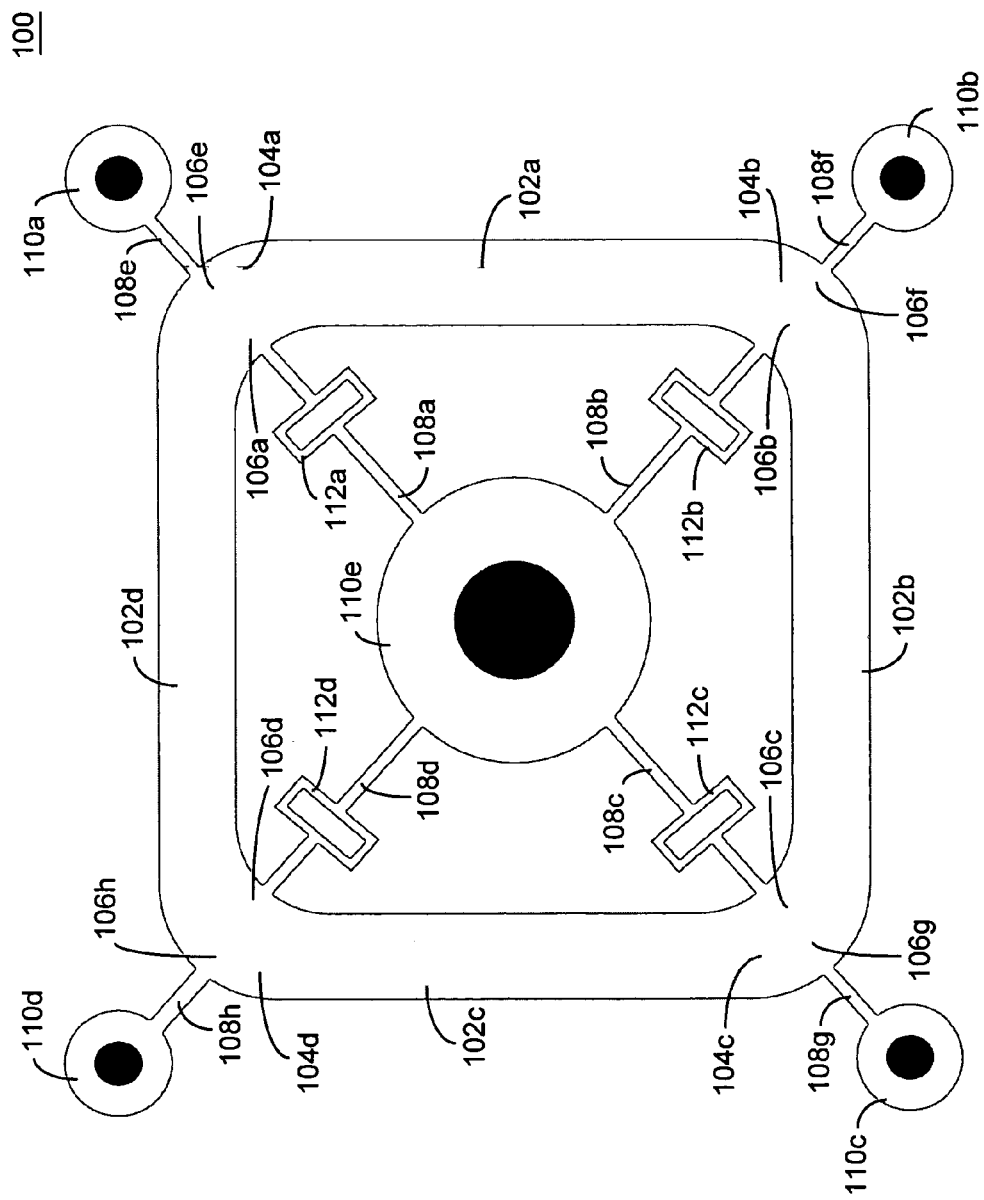
FIG. 39 illustrates a top view of a rounded square shaped microelectromechanical resonators according to another embodiment of present inventions wherein the rounded square shaped microelectromechanical resonators are anchored to the substrate using another anchoring technique and/or configuration.
Figure 41:
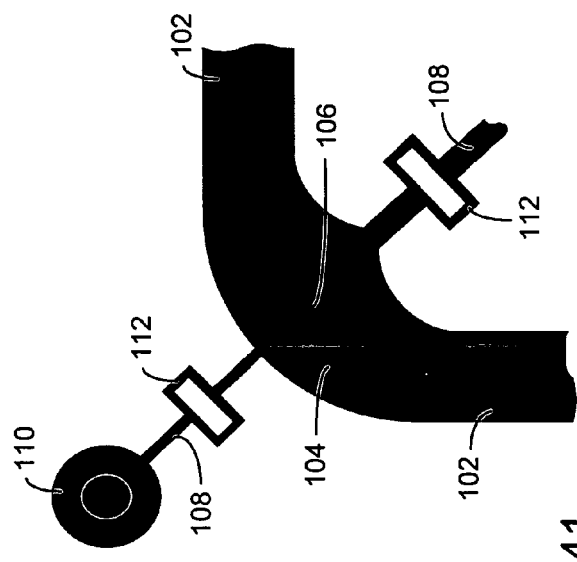
FIGS. 40–41 are top views of various embodiments of anchor coupling sections and stress/strain mechanisms, in conjunction with a curved section of a microelectromechanical resonator, according to certain embodiments of present inventions.
Figure 40:
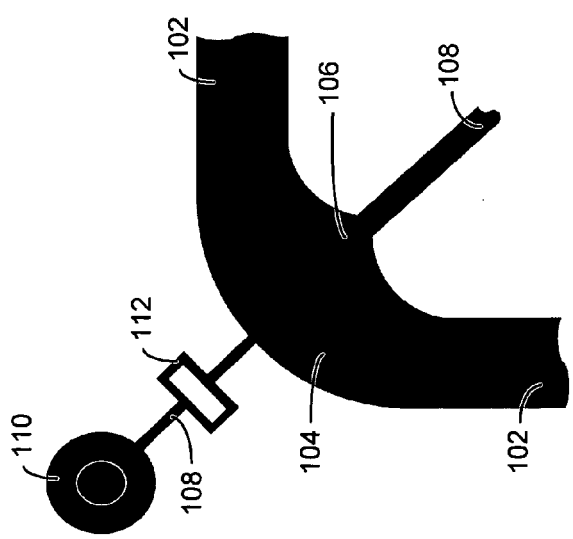

As mentioned above, MEMS resonator 100 may employ any anchoring technique or anchor structure, whether now known or later developed. In addition, the stress/strain management techniques/structures (for example, stress/strain mechanisms 112) may be implemented in conjunction with any of the anchoring technique or anchor structure described and illustrated herein and/or, whether now known or later developed. For example, the substrate anchors and/or stress/strain management techniques/structures may be placed at one, some or all of nodal points and/or anchors. (See, for example, FIGS. 7A, 7B, and 8–10). Other substrate anchoring-stress/strain management techniques may also be suitable. (See, for example, FIGS. 39–41). Indeed, MEMS resonator 100 may be coupled to a substrate anchor (and stress/strain mechanism 112) at non-nodal points in a symmetrical or non-symmetrical manner (for example, in or around a "center" of MEMS resonator 100).

In the claims, the term "straight elongated beam section" means (i) a straight or substantially straight elongated beam, and/or (ii) an elongated beam having a longitudinal axis that is straight or substantially straight regardless of variations in thickness and/or width (if any) of the beam, and/or (iii) a beam that is substantially more straight than curved.

Further, in the claims, the term "slots" means openings, voids and/or slots (whether extending partially or entirely through the entire height/thickness of the beam section), of any shape and/or size.

The above embodiments of the present invention are merely exemplary. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present invention. As such, the foregoing description of the exemplary embodiments of the invention has been presented for the purposes of illustration and description. Many modifications and variations are possible in light of the above teaching. It is intended that the scope of the invention not be limited solely to this detailed description.

What is claimed is:

1. A microelectromechanical resonator structure comprising:
   a plurality of elongated straight beam sections wherein each beam section includes a first end and a second end;
   a plurality of curved sections, wherein each curved section includes a first end and a second end, and wherein at least one curved section includes a nodal point;
   wherein each end of a beam section is connected to an associated end of one of the curved section to thereby form a geometric shape;
   at least one anchor coupling section; and
   a substrate anchor, coupled to the nodal point via the anchor coupling section, to secure the resonator structure to a substrate.

2. The microelectromechanical resonator structure of claim 1 further including a stress/strain relief mechanism coupled between the substrate anchor and the nodal point.

3. The microelectromechanical resonator structure of claim 1 wherein:
   the plurality of elongated straight beam sections include first, second and third elongated straight beam sections;
   the plurality of curved sections include first, second and third elongated curved sections; and
   wherein the geometric shape is a rounded triangle shape.

4. The microelectromechanical resonator structure of claim 1 wherein:
   the plurality of elongated straight beam sections include first, second, third and fourth elongated straight beam sections;
   the plurality of curved sections include first, second, third and fourth elongated curved sections; and
   wherein the geometric shape is a rounded rectangle shape.

5. The microelectromechanical resonator structure of claim 1 wherein:
   the plurality of elongated straight beam sections include first, second, third and fourth elongated straight beam sections;

the plurality of curved sections include first, second, third and fourth elongated curved sections; and
wherein the geometric shape is a rounded square shape.

6. The microelectromechanical resonator structure of claim 5 wherein each curved section includes at least one nodal point.

7. The microelectromechanical resonator structure of claim 6 wherein the substrate anchor is coupled to the at least one nodal point of each curved section.

8. The microelectromechanical resonator structure of claim 7 further including a plurality of stress/strain relief mechanisms coupled between the substrate anchor and each nodal point of the at least one nodal point of each curved section.

9. The microelectromechanical resonator structure of claim 6 wherein the substrate anchor includes a plurality of anchors and wherein the at least one nodal point of each curved section is coupled to at least one of the plurality of anchors to secure the resonator structure to a substrate.

10. The microelectromechanical resonator structure of claim 9 further including a plurality of stress/strain relief mechanisms coupled between each anchor and the at least one nodal point of each curved section.

11. The microelectromechanical resonator structure of claim 1 wherein one of the plurality of elongated straight beam sections includes a plurality of slots disposed therein.

12. The microelectromechanical resonator structure of claim 1 wherein one of the plurality of curved sections includes a plurality of slots disposed therein.

13. The microelectromechanical resonator structure of claim 1 wherein the width of each elongated straight beam sections of the plurality of elongated straight beam sections is greater at the ends than in the center thereof.

14. The microelectromechanical resonator structure of claim 1 wherein the plurality of elongated straight beam sections are filleted at the ends thereof.

15. A microelectromechanical resonator structure comprising:
    a plurality of elongated straight beam sections wherein each beam section includes a first end and a second end;
    a plurality of curved sections, wherein each curved section includes a first end and a second end, and wherein each curved section includes a nodal point;
    wherein each end of a beam section is connected to an associated end of one of the curved sections to thereby form a geometric shape;
    a plurality of anchor coupling sections; and
    a substrate anchor, coupled to the nodal points of each curved section via the plurality of anchor coupling sections, to secure the resonator structure to a substrate.

16. The microelectromechanical resonator structure of claim 15 further including a plurality of stress/strain relief mechanisms, wherein each stress/strain relief mechanism is coupled between the substrate anchor and an associated nodal point.

17. The microelectromechanical resonator structure of claim 15 wherein:
    the plurality of elongated straight beam sections include first, second, third and fourth elongated straight beam sections;
    the plurality of curved sections include first, second, third and fourth elongated curved sections; and
    wherein the geometric shape is a rounded square shape.

18. The microelectromechanical resonator structure of claim 15 wherein the substrate anchor includes a plurality of anchors and wherein the at least one nodal point of each curved section is coupled to at least one of the plurality of anchors to secure the resonator structure to a substrate.

19. The microelectromechanical resonator structure of claim 18 further including a plurality of stress/strain relief mechanisms coupled between an associated anchor of the plurality of anchors and an associated nodal point of the at least one nodal point of each curved section.

20. The microelectromechanical resonator structure of claim 18 wherein the nodal point of each curved section is located on an inner portion of the curved section.

21. The microelectromechanical resonator structure of claim 18 wherein the nodal point of each curved section is located on an outer portion of the curved section.

22. The microelectromechanical resonator structure of claim 15 wherein the plurality of elongated straight beam sections includes a plurality of slots disposed therein.

23. The microelectromechanical resonator structure of claim 15 wherein the plurality of curved sections includes a plurality of slots disposed therein.

24. A microelectromechanical resonator structure comprising:
    a plurality of elongated straight beam sections wherein each beam section includes a first end and a second end;
    a plurality of curved sections, wherein each curved section includes a first end and a second end, and wherein each curved section includes at least one nodal point;
    wherein each end of a beam section is connected to an associated end of one of the curved sections to thereby form a geometric shape;
    a substrate anchor, coupled to at least one nodal point of each curved section, to secure the resonator structure to a substrate;
    a plurality of sense electrodes;
    a plurality of drive electrodes, wherein the sense and drive electrodes are juxtaposed the plurality of elongated straight beam sections; and
    sense circuitry, coupled to the sense electrodes, to provide an output signal.

25. The microelectromechanical resonator structure of claim 24 wherein the sense electrodes provide one or more signals to the sense circuitry which, in response, provides a differential output signal.

26. The microelectromechanical resonator structure of claim 25 further including a plurality of stress/strain relief mechanisms, wherein each stress/strain relief mechanism is coupled between the substrate anchor and an associated nodal point.

27. The microelectromechanical resonator structure of claim 25 wherein the plurality of curved sections includes a plurality of slots disposed therein.

28. The microelectromechanical resonator structure of claim 25 wherein:
    the plurality of elongated straight beam sections include first, second, third and fourth elongated straight beam sections;
    the plurality of curved sections include first, second, third and fourth elongated curved sections; and
    wherein the geometric shape is a rounded square shape.

29. The microelectromechanical resonator structure of claim 28 wherein the substrate anchor is disposed within the rounded square shape of the microelectromechanical resonator structure.

30. The microelectromechanical resonator structure of claim 28 wherein the substrate anchor includes a plurality of anchors and wherein the at least one nodal point of each curved section is coupled to at least one of the plurality of anchors to secure the resonator structure to a substrate.

31. The microelectromechanical resonator structure of claim 30 further including a plurality of stress/strain relief mechanisms coupled between an associated anchor of the plurality of anchors and an associated nodal point of the at least one nodal point of each curved section.

32. The microelectromechanical resonator structure of claim 30 wherein the nodal point of each curved section is located on an inner portion of the curved section.

33. The microelectromechanical resonator structure of claim 30 wherein the nodal point of each curved section is located on an outer portion of the curved section.

34. The microelectromechanical resonator structure of claim 25 wherein the plurality of elongated straight beam sections includes a plurality of slots disposed therein.

35. The microelectromechanical resonator structure of claim 24 wherein the sense electrodes provide one or more signals to the sense circuitry which, in response, provides a single ended output signal.

* * * * *